US011641730B2

(12) United States Patent
Jung et al.

(10) Patent No.: US 11,641,730 B2
(45) Date of Patent: May 2, 2023

(54) SEMICONDUCTOR MEMORY DEVICES AND METHODS OF FABRICATING THE SAME

(71) Applicant: Samsung Electronics Co., Ltd., Suwon-si (KR)

(72) Inventors: Kyooho Jung, Seoul (KR); Jeong-Gyu Song, Seongnam-si (KR); Younsoo Kim, Yongin-si (KR); Jooho Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/558,687

(22) Filed: Dec. 22, 2021

(65) Prior Publication Data

US 2022/0115380 A1    Apr. 14, 2022

Related U.S. Application Data

(63) Continuation of application No. 16/795,625, filed on Feb. 20, 2020, now Pat. No. 11,239,239.

(30) Foreign Application Priority Data

Jun. 14, 2019    (KR) .................. 10-2019-0070993

(51) Int. Cl.
*H01L 27/108*    (2006.01)
*H01L 49/02*    (2006.01)

(52) U.S. Cl.
CPC .. *H01L 27/10852* (2013.01); *H01L 27/10814* (2013.01); *H01L 28/60* (2013.01)

(58) Field of Classification Search
CPC ......... H01L 27/10852; H01L 27/10814; H01L 28/60; H01L 27/10855; H01L 28/40;
(Continued)

(56) References Cited

U.S. PATENT DOCUMENTS 5,525,550 A    6/1996    Kato
6,573,137 B1    6/2003    Divakaruni et al.
(Continued)

FOREIGN PATENT DOCUMENTS

KR    100505668 B1    8/2005
KR    1020170096134 A    8/2017

*Primary Examiner* — Edward Chin
(74) *Attorney, Agent, or Firm* — Myers Bigel, P.A.

(57) ABSTRACT

Disclosed are semiconductor memory devices and methods of fabricating the same. The semiconductor memory devices may include a capacitor including first and second electrodes and a dielectric layer. The dielectric layer may include a zirconium aluminum oxide layer including a first zirconium region adjacent to the first electrode, a first aluminum region, a second aluminum region adjacent to the second electrode, and a second zirconium region between the first and second aluminum regions. The first and second zirconium regions may include zirconium and oxygen and may be devoid of aluminum. The first and second aluminum regions may include aluminum and oxygen and may be devoid of zirconium. The first aluminum region and the first zirconium region may be spaced apart by a first distance, and the first aluminum region and the second zirconium region may be spaced apart by a second distance shorter than the first distance.

20 Claims, 24 Drawing Sheets

(58) Field of Classification Search
CPC .......... H01L 27/0629; H01L 21/02178; H01L 21/02181; H01L 21/02189; H01L 21/02271; H01L 21/28556; H01L 21/324; H01L 27/10808; H01L 27/1085; H01L 28/75; H01L 28/91

See application file for complete search history.

(56) References Cited

U.S. PATENT DOCUMENTS

| | | |
|---|---|---|
| 6,894,335 B2 | 5/2005 | LaFleur |
| 6,992,019 B2 | 1/2006 | Lee et al. |
| 7,148,155 B1 | 12/2006 | Tarafdar et al. |
| 7,745,352 B2 | 6/2010 | Mallick et al. |
| 7,790,633 B1 | 9/2010 | Tarafdar et al. |
| 10,043,655 B2 | 8/2018 | Swaminathan et al. |
| 2004/0168627 A1 | 9/2004 | Conley et al. |
| 2015/0031186 A1* | 1/2015 | Kim ................. H01L 21/318 438/396 |
| 2017/0287706 A1 | 10/2017 | Jung et al. |
| 2018/0323200 A1 | 11/2018 | Tang et al. |

* cited by examiner

SEMICONDUCTOR MEMORY DEVICES AND METHODS OF FABRICATING THE SAME

CROSS-REFERENCE TO RELATED APPLICATION

This application is a continuation of U.S. patent application Ser. No. 16/795,625, filed Feb. 20, 2020, which claims priority under 35 U.S.C. § 119 to Korean Patent Application No. 10-2019-0070993 filed on Jun. 14, 2019 in the Korean Intellectual Property Office, the disclosure of which is hereby incorporated by reference in its entirety.

FIELD

The present inventive concepts relate to a semiconductor memory device and a method of fabricating the same.

BACKGROUND

Semiconductor devices are beneficial in the electronics industry because of their small size, multi-functionality, and/or low fabrication cost. However, semiconductor devices are being highly integrated with the remarkable development of the electronics industry. Line widths of patterns of semiconductor devices are being reduced for high integration thereof. New exposure techniques and/or expensive exposure techniques may be used for fine patterns to manufacture highly integrated semiconductor devices. Various studies have thus recently been conducted for new integration techniques.

SUMMARY

Some example embodiments of the present inventive concepts provide a semiconductor memory device with increased reliability.

Some example embodiments of the present inventive concepts provide a method of fabricating a semiconductor memory device, which method is capable of reducing a leakage current.

According to some example embodiments of the present inventive concepts, semiconductor memory devices may include a capacitor. The capacitor may include a first electrode, a second electrode, and a dielectric layer between the first electrode and the second electrode. The dielectric layer may include a zirconium aluminum oxide layer including a first zirconium region adjacent to the first electrode, a first aluminum region spaced apart from both of the first electrode and the second electrode, a second aluminum region adjacent to the second electrode, and a second zirconium region between the first aluminum region and the second aluminum region. Each of the first and second zirconium regions may include zirconium and oxygen and may be devoid of aluminum. Each of the first and second aluminum regions may include aluminum and oxygen and may be devoid of zirconium. The first aluminum region and the first zirconium region may be spaced apart from each other by a first distance, and the first aluminum region and the second zirconium region may be spaced apart from each other by a second distance that may be shorter than the first distance.

According to some example embodiments of the present inventive concepts, semiconductor memory devices may include a capacitor. The capacitor may include a first electrode, a second electrode, and a dielectric layer between the first electrode and the second electrode. The dielectric layer may include a hafnium oxide layer adjacent to the first electrode and a zirconium aluminum oxide layer adjacent to the second electrode. The zirconium aluminum oxide layer may include a first surface contacting the hafnium oxide layer and a second surface contacting the second electrode, and an aluminum concentration in the zirconium aluminum oxide layer may be highest at the second surface and lowest at the first surface.

According to some example embodiments of the present inventive concepts, semiconductor memory devices may include a capacitor. The capacitor may include a first electrode, a second electrode, and a dielectric layer between the first electrode and the second electrode. The dielectric layer may include a first dielectric layer including an A-metal, a B-metal, and oxygen, and a concentration of the B-metal in the first dielectric layer may be lowest adjacent to the first electrode and highest adjacent to the second electrode.

According to some example embodiments of the present inventive concepts, methods of fabricating a semiconductor memory device may include depositing a first zirconium oxide layer on a substrate, depositing a first aluminum oxide layer on the first zirconium oxide layer, depositing a second zirconium oxide layer on the first aluminum oxide layer, and performing a first annealing process that causes aluminum atoms in the first aluminum oxide layer to diffuse into the first zirconium oxide layer and the second zirconium oxide layer, thereby forming a preliminary dielectric layer that includes a first diffusion region and a second diffusion region. The methods may also include depositing a third zirconium oxide layer on the preliminary dielectric layer and depositing a second aluminum oxide layer on the third zirconium oxide layer.

According to some example embodiments of the present inventive concepts, methods of fabricating a semiconductor memory device may include depositing a first A-metal oxide layer including an A-metallic element on a substrate, depositing a first B-metal oxide layer including a B-metallic element on the first A-metal oxide layer, depositing a second A-metal oxide layer including the A-metallic element on the first B-metal oxide layer, and performing a first annealing process that causes the B-metallic element in the first B-metal oxide layer to diffuse into the first A-metal oxide layer and the second A-metal oxide layer, thereby forming a preliminary dielectric layer that includes a first diffusion region and a second diffusion region. The methods may also include depositing a third A-metal oxide layer including the A-metallic element on the preliminary dielectric layer and depositing a second B-metal oxide layer including the B-metallic element on the third A-metal oxide layer.

According to some example embodiments of the present inventive concepts, methods of fabricating a semiconductor memory device may include depositing a first A-metal oxide layer on a substrate, depositing a first B-metal oxide layer including a B-metallic element on the first A-metal oxide layer, and performing a first annealing process that causes the B-metallic element in the first B-metal oxide layer to diffuse into the first A-metal oxide layer, thereby forming a preliminary dielectric layer that may include a first diffusion region. The methods may also include depositing a second A-metal oxide layer on the preliminary dielectric layer, depositing a second B-metal oxide layer including the B-metallic element on the second A-metal oxide layer, and performing a second annealing process that causes the B-metallic element in the second B-metal oxide layer to diffuse into the second A-metal oxide layer, thereby forming a dielectric layer that may include a second diffusion region.

According to some example embodiments of the present inventive concepts, methods of fabricating a capacitor of a semiconductor memory device may include forming a first electrode and forming a dielectric layer and a second electrode on the first electrode. The dielectric layer may be between the first electrode and the second electrode and may include a first A-metal oxide region including an A-metallic element, a second A-metal oxide region including the A-metallic element on the first A-metal oxide region, a first B-metal oxide region including a B-metallic element between the first A-metal oxide region and the second A-metal oxide region, and a second B-metal oxide region including the B-metallic element between the second A-metal oxide region and the second electrode. Each of the first A-metal oxide region and the second A-metal oxide region may be devoid of the B-metallic element. Each of the first B-metal oxide region and the second B-metal oxide region may be devoid of the A-metallic element. The first A-metal oxide region and the first B-metal oxide region may be spaced apart from each other by a first distance, and the first B-metal oxide region and the second A-metal oxide region may be spaced apart from each other by a second distance that may be shorter than the first distance.

DETAILED DESCRIPTION

Some example embodiments of the present inventive concepts will now be described in detail with reference to the accompanying drawings to aid in clearly explaining the present inventive concepts.

Figure 1:
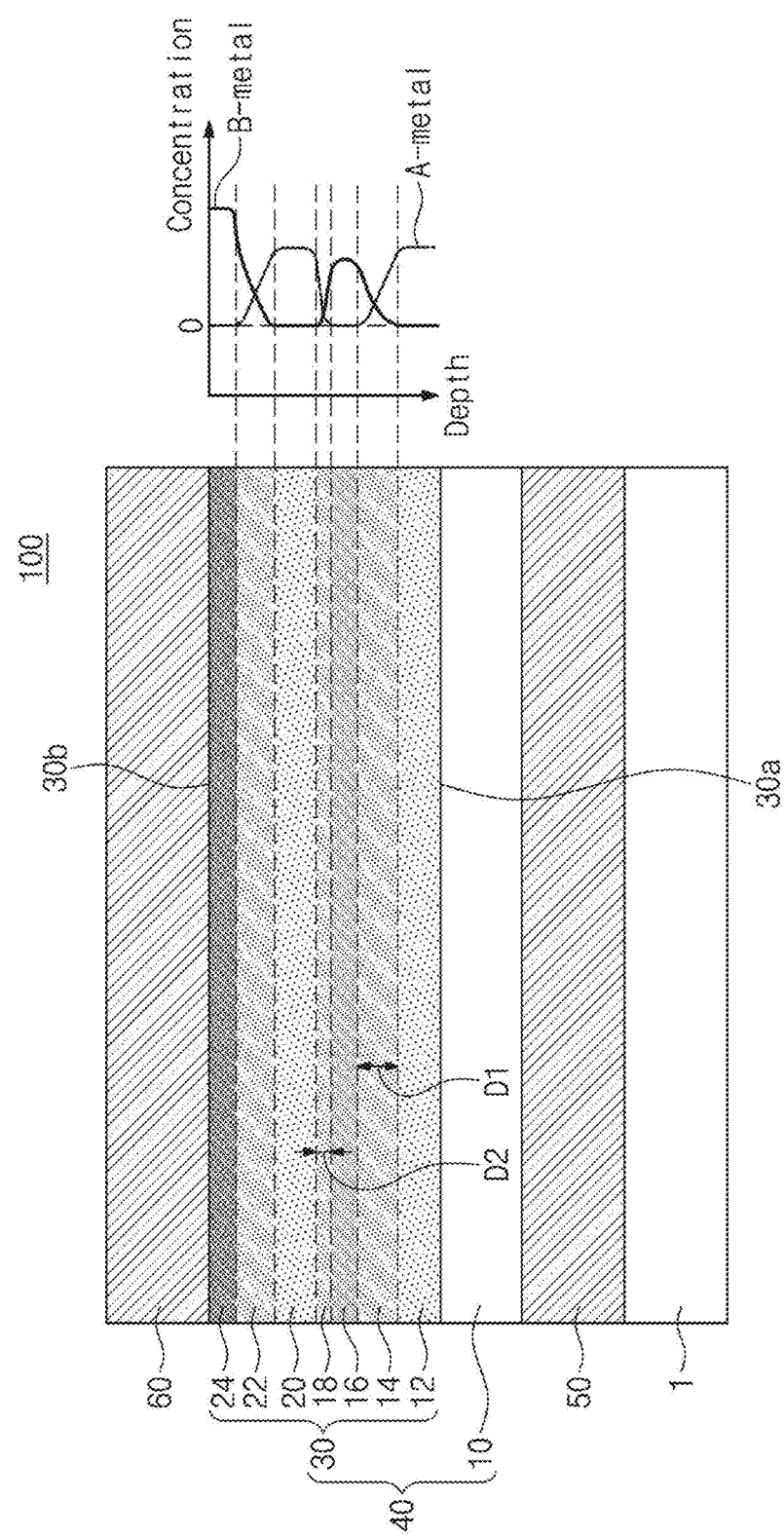
FIG. 1 illustrates a cross-sectional view showing a semiconductor memory device according to some example embodiments of the present inventive concepts.

FIG. 1 illustrates a cross-sectional view showing a semiconductor memory device according to some example embodiments of the present inventive concepts.

Referring to FIG. 1, a semiconductor memory device 100 according to the present embodiment may include a first electrode 50 disposed on a substrate 1. A second electrode 60 may be disposed on the first electrode 50. A dielectric layer 40 may be interposed between the first electrode 50 and the second electrode 60. A capacitor may be constituted by the first electrode 50, the second electrode 60, and the dielectric layer 40. The substrate 1 may be a single crystalline silicon substrate or a silicon-on-insulator (SOI) substrate. Although not shown, the substrate 1 and the first electrode 50 may be provided therebetween with an interlayer dielectric layer, a transistor, a contact plug, a connection line, etc. For example, the first electrode 50 and the second electrode 60 may independently include one or more of an impurity-doped polysilicon layer, an impurity-doped silicon-germanium layer, a metal nitride layer such as a titanium nitride layer, and a metal layer such as a tungsten layer, a copper layer, and an aluminum layer. The first electrode 50 may be called a bottom electrode. The second electrode 60 may be called a top electrode.

The dielectric layer 40 may include a first dielectric layer 10 and a second dielectric layer 30. The first dielectric layer 10 may be interposed between the second dielectric layer 30 and the first electrode 50. In some embodiments, the second dielectric layer 30 may include a material whose thermal stability is superior to that of the first dielectric layer 10. The second dielectric layer 30 may have a first surface 30a in contact with the first dielectric layer 10 and a second surface 30b in contact with the second electrode 60. The second dielectric layer 30 may preferably include an A-metal, a B-metal, and oxygen. An oxide layer of the A-metal may have a dielectric constant greater than that of an oxide layer of the B-metal. The oxide layer of the A-metal may have a grain size greater than that of the oxide layer of the B-metal. The A-metal may preferably be, for example, hafnium (Hf) or zirconium (Zr). The B-metal may preferably be, for example, niobium (Nb) or aluminum (Al). The second dielectric layer 30 may preferably be, for example, a zirconium aluminum oxide layer, a hafnium aluminum oxide layer, a zirconium niobium oxide layer, or a hafnium niobium oxide layer.

The first dielectric layer 10 may include, for example, a material whose dielectric constant is greater than that of the second dielectric layer 30. The first dielectric layer 10 may preferably be, for example, a hafnium oxide layer. In this case, the first dielectric layer 10 may have a tetragonal crystal structure and a thickness ranging from about 1 Å to 15 Å. The first dielectric layer 10 may serve to supplement an overall dielectric constant of the dielectric layer 40. When the second dielectric layer 30 is enough to provide the dielectric layer 40 with a desired dielectric constant and thermal stability, the first dielectric layer 10 may be omitted.

When a case is given in which the A-metal is zirconium, the B-metal is aluminum, and the first dielectric layer 10 is formed of a hafnium oxide layer, this case may be an example in which the first dielectric layer 10 excludes (e.g., may not include, may be devoid of) the A-metal and the B-metal, but includes a C-metal (e.g., hafnium) different from the A-metal and the B-metal. In contrast, when the A-metal is hafnium, the first dielectric layer 10 may be omitted or may include the A-metal.

A concentration of the B-metal contained in the second dielectric layer 30 may be highest at or adjacent to the second surface 30b and lowest at or adjacent to the first surface 30a. A concentration of the A-metal contained in the second dielectric layer 30 may be highest at or adjacent to the first surface 30a and lowest at or adjacent to the second surface 30b. In some embodiments, the concentration of the A-metal in the second dielectric layer 30 and the concentration of the B-metal in the second dielectric layer 30 may vary within the second dielectric layer 30 as illustrated in FIG. 1.

The second dielectric layer 30 may be divided into regions based on concentration gradients of atoms of the A- and B-metals. For example, the second dielectric layer 30 may include a first A-metal region 12 adjacent to (e.g., closest to) the first electrode 50, a first B-metal region 16 spaced apart from both of the first and second electrodes 50 and 60, a second B-metal region 24 adjacent to (e.g., closest to) the second electrode 60, and a second A-metal region 20 between the first B-metal region 16 and the second B-metal region 24. The first and second A-metal regions 12 and 20 may include the A-metal and the oxygen, but exclude the B-metal. When the A-metal is zirconium, the first and second A-metal regions 12 and 20 may be respectively called first and second zirconium regions. When the A-metal is hafnium, the first and second A-metal regions 12 and 20 may be respectively called first and second hafnium regions. The first and second B-metal regions 16 and 24 may include the B-metal and oxygen, but exclude the A-metal. When the B-metal is aluminum, the first and second B-metal regions 16 and 24 may be respectively called first and second aluminum regions. When the B-metal is niobium, the first and second B-metal regions 16 and 24 may be respectively called first and second niobium regions. In some embodiments, the first and second A-metal regions 12 and 20 may include the A-metal and oxygen but may not include or may be devoid of the B-metal. In some embodiments, the first and second B-metal regions 16 and 24 may include the B-metal and oxygen but may not include or may be devoid of the A-metal.

A first distance D1 between the first B-metal region 16 and the first A-metal region 12 may be greater than a second distance D2 between the first B-metal region 16 and the second A-metal region 20. A first diffusion region 14 may be disposed between the first B-metal region 16 and the first A-metal region 12. A second diffusion region 18 may be disposed between the first B-metal region 16 and the second A-metal region 20. A third diffusion region 22 may be disposed between the second A-metal region 20 and the second B-metal region 24. Each of the first, second, and third diffusion regions 14, 18, and 22 may include the A-metal, the B-metal, and oxygen. The first diffusion region 14 may be wider than the second diffusion region 18. For example, the first diffusion region 14 may have a vertical width (corresponding to the first distance D1) greater than a vertical width (corresponding to the second distance D2) of the second diffusion region 18. When the A-metal is zirconium and the B-metal is aluminum, the first, second, and third diffusion regions 14, 18, and 22 may respectively be called first, second, and third zirconium aluminum regions. When the A-metal is hafnium and the B-metal is niobium, the first, second, and third diffusion regions 14, 18, and 22 may respectively be called first, second, and third hafnium niobium regions. The third diffusion region 22 may be wider than the second diffusion region 18. In some embodiments, the third diffusion region 22 may have a vertical width greater than a vertical width of the second diffusion region 18 as illustrated in FIG. 1. A vertical direction may refer to a direction along which the first A-metal region 12, the first diffusion region 14, and the first B-metal region 16 are stacked, and the first A-metal region 12 and the first B-metal region 16 are spaced apart from each other in the vertical direction. A concentration of the A-metal or the B-metal in a single region (e.g., the first A-metal region 12, the first B-metal region 16, the second A-metal region 20, the second B-metal region 24, or one of the first, second, and third diffusion regions 14, 18, and 22) may be an average concentration of the A-metal or the B-metal in the region.

The second dielectric layer 30 may be in a crystalline state. The second surface 30b may have a surface roughness less than that of a zirconium oxide layer. The second surface 30b may have a root-mean-square roughness (Rq) ranging, preferably, from about 1 nm to about 4.7 nm. The surface roughness of the second dielectric layer 30 may be relatively small to reduce a leakage current and to improve breakdown voltage characteristics. Because the dielectric layer 40 includes the first dielectric layer 10 and the second dielectric layer 30, the dielectric layer 40 may have a high dielectric constant, excellent thermal stability, a reduced leakage current, and improved breakdown voltage characteristics. As a result, the semiconductor memory device 100 may increase in reliability.

Figure 2A:
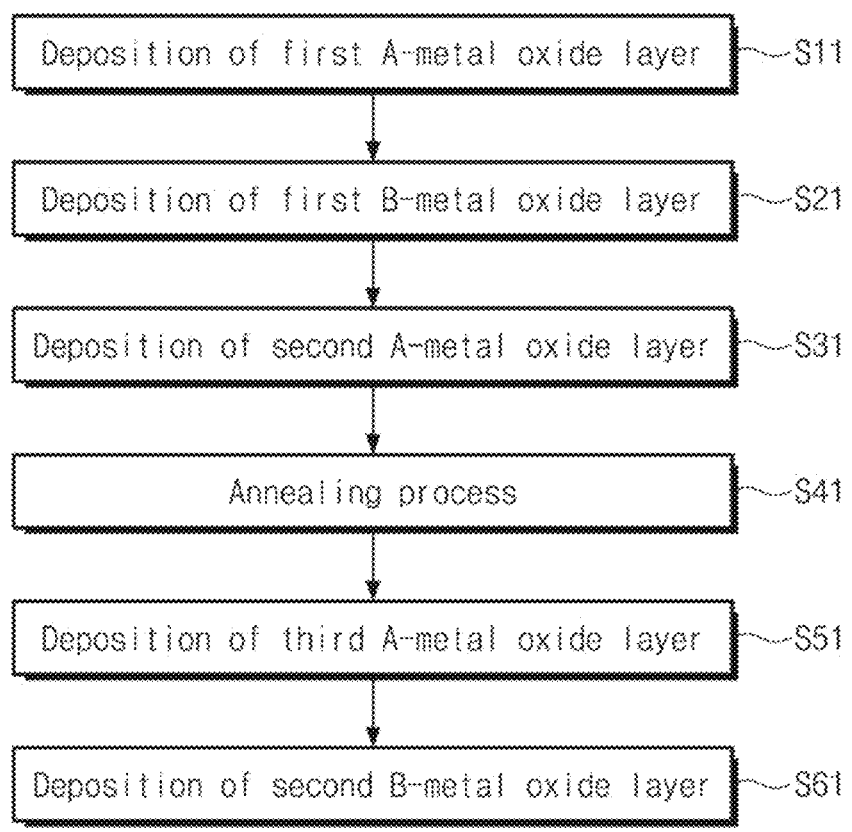
FIG. 2A is a flow chart showing a method of fabricating a semiconductor memory device according to some example embodiments of the present inventive concepts.
Figure 3A:
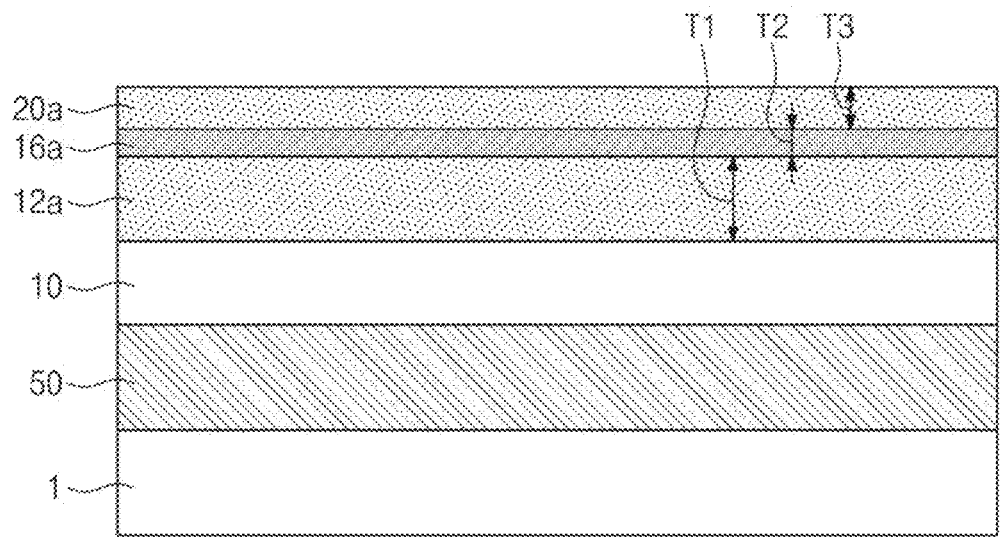
FIGS. 3A to 3C illustrate cross-sectional views showing a method of fabricating the semiconductor memory device of FIG. 1, according to some example embodiments of the present inventive concepts.
Figure 3B:
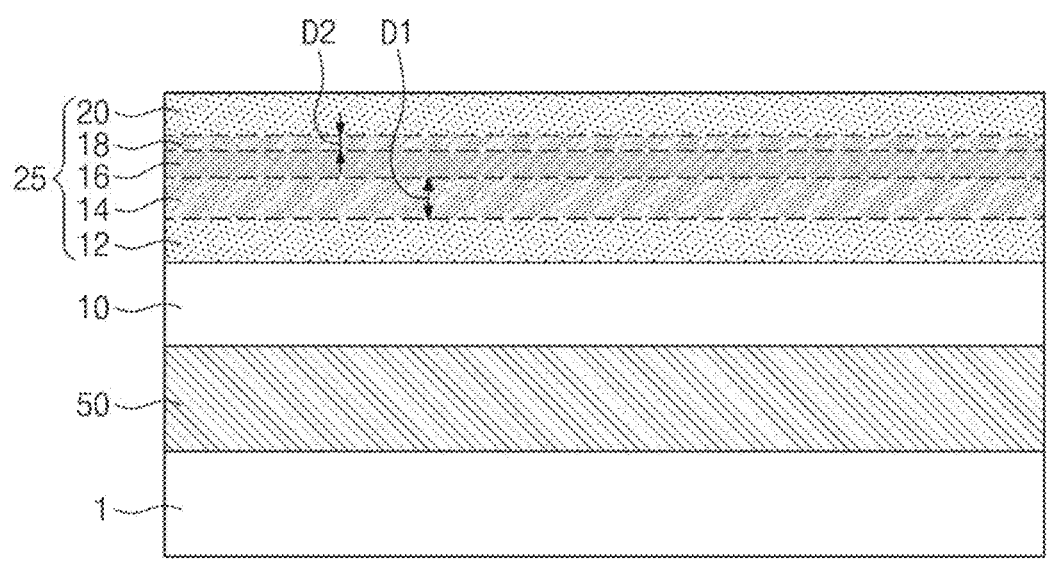
Figure 3C:
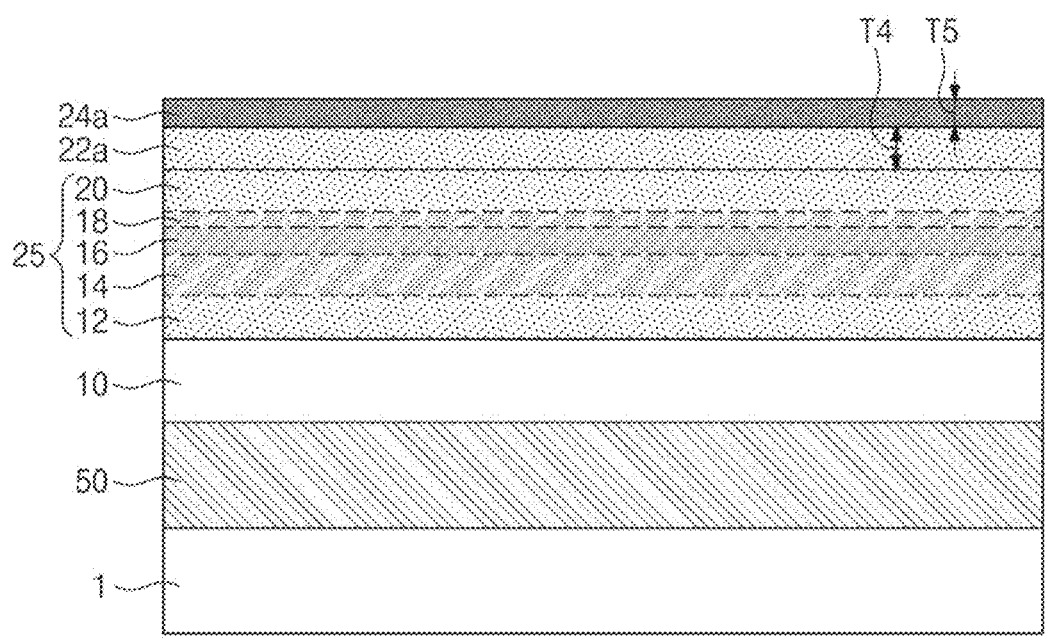

The following will describe a method of fabricating the semiconductor memory device of FIG. 1. FIG. 2A is a flow chart showing a method of fabricating a semiconductor memory device according to some example embodiments of the present inventive concepts. FIGS. 3A to 3C illustrate cross-sectional views showing a method of fabricating the semiconductor memory device of FIG. 1, according to some example embodiments of the present inventive concepts.

Referring to FIGS. 2A and 3A, a substrate 1 may be first prepared. A first electrode 50 may be formed on the substrate 1. The first electrode 50 may be formed of a conductive material. A first dielectric layer 10 may be formed on the first electrode 50. The first dielectric layer 10 may be formed of a hafnium oxide layer by performing a deposition process, such as atomic layer deposition (ALD) or chemical vapor deposition (CVD).

A deposition process, such as ALD or CVD, may be performed to deposit a first A-metal oxide layer 12a on the first dielectric layer 10 (a first step, S11). The first A-metal oxide layer 12a may be formed to have a first thickness T1. The first A-metal oxide layer 12a may be deposited in an amorphous state. For example, the first A-metal oxide layer 12a may be, preferably, a zirconium oxide layer or a hafnium oxide layer.

A deposition process, such as ALD or CVD, may be performed to deposit a first B-metal oxide layer 16a on the first A-metal oxide layer 12a (a second step, S21). The first B-metal oxide layer 16a may be formed to have a second thickness T2. The second thickness T2 may be less than the first thickness T1. The first B-metal oxide layer 16a may be deposited in an amorphous state. For example, the first B-metal oxide layer 16a may be, preferably, an aluminum oxide layer or a niobium oxide layer. When the first A-metal oxide layer 12a is a zirconium oxide layer and the first B-metal oxide layer 16a is an aluminum oxide layer, because a grain size after crystallization is larger for the zirconium oxide layer than for the aluminum oxide layer, grains of the aluminum oxide layer may serve to fill gaps between grains of the zirconium oxide layer, which may result in a reduction in surface roughness. Accordingly, a leakage current may be reduced. It will be understood that "an element A fills an element B" (or similar language) as used herein means that the element A is in the element B but does not necessarily mean that the element A fills the element B entirely.

A deposition process, such as ALD or CVD, may be performed to deposit a second A-metal oxide layer 20a on the first B-metal oxide layer 16a (a third step, S31). The second A-metal oxide layer 20a may be formed to have a third thickness T3. The third thickness T3 may be less than the first thickness T1 and greater than the second thickness T2. The third thickness T3 may be, preferably, half the first thickness T1. The second A-metal oxide layer 20a may be deposited in an amorphous state. The second A-metal oxide layer 20a may be, preferably, a zirconium oxide layer or a hafnium oxide layer.

Referring to FIGS. 2A and 3B, an annealing process may be performed (a fourth step, S41). One or more of nitrogen, argon, and oxygen may be supplied to perform the annealing process. In this case, nitrogen or argon may serve to possibly prevent or reduce oxidation of the first electrode 50. In the annealing process, oxygen may act to possibly prevent or reduce the oxide layers 12a, 20a, and 16a from losing their combined oxygen to the atmosphere. The annealing process may be performed at a temperature of 350° C. to 500° C. The annealing process may cause the B-metal included in the first B-metal oxide layer 16a to diffuse into the first and second A-metal oxide layers 12a and 20a to form a first diffusion region 14 and a second diffusion region 18. Because the first A-metal oxide layer 12a is thicker than the second A-metal oxide layer 20a, the first diffusion region 14 may be formed to have a vertical width (corresponding to a first distance D1) greater than a vertical width (corresponding to a second distance D2) of the second diffusion region 18. The first and second diffusion regions 14 and 18 may include the A-metal, the B-metal, and oxygen.

An indistinct boundary may be established between the first B-metal oxide layer 16a and each of the first and second A-metal oxide layers 12a and 20a. Therefore, a first A-metal region 12 may be formed between the first diffusion region 14 and the first dielectric layer 10, a first B-metal region 16 may be formed between the first diffusion region 14 and the second diffusion region 18, and a second A-metal region 20 may be formed on the second diffusion region 18. As a result, a second preliminary dielectric layer 25 may be formed. The annealing process may cause that the second preliminary dielectric layer 25 is changed into a crystalline state. The time and temperature of the annealing process may be controlled to exist concentration gradients of the A-metal and the B-metal in the second preliminary dielectric layer 25.

Referring to FIGS. 2A and 3C, a deposition process, such as ALD or CVD, may be performed to deposit a third A-metal oxide layer 22a on the second preliminary dielectric layer 25 (a fifth step, S51). The third A-metal oxide layer 22a may be deposited in an amorphous state. The third A-metal oxide layer 22a may be formed to have a fourth thickness T4. The fourth thickness T4 may be less than the first thickness T1. For example, the first thickness T1 may be the same as a sum of the third thickness T3 and the fourth thickness T4. The fourth thickness T4 may be, preferably, half the first thickness T1. For example, the third A-metal oxide layer 22a may be, preferably, a zirconium oxide layer or a hafnium oxide layer. Because the third A-metal oxide layer 22a is formed to have the fourth thickness T4 relatively less than the first thickness T1 in a condition that the second preliminary dielectric layer 25 is changed to have a crystalline state, the third A-metal oxide layer 22a may have a relatively small grain size. Thus, a reduced surface roughness may be provided on a second surface (see 30b of FIG. 1) of a second dielectric layer (see 30 of FIG. 1) which is eventually formed as discussed below.

The third A-metal oxide layer 22a may be in contact with the second A-metal region 20 of the second preliminary dielectric layer 25. Because the second A-metal region 20 does not include the B-metal, the second A-metal region 20 may have substantially the same material and structure as those of the third A-metal oxide layer 22a. Therefore, after the deposition of the third A-metal oxide layer 22a, no distinct boundary may be provided between the third A-metal oxide layer 22a and the second A-metal region 20.

A deposition process, such as ALD or CVD, may be performed to deposit a second B-metal oxide layer 24a on the third A-metal oxide layer 22a (a sixth step, S61). For example, the second B-metal oxide layer 24a may be, preferably, an aluminum oxide layer or a niobium oxide layer. The second B-metal oxide layer 24a may be deposited in an amorphous state. The second B-metal oxide layer 24a may be formed to have a fifth thickness T5. The fifth thickness T5 may be less than the first, third, and fourth thicknesses T1, T3, and T4. The fifth thickness T5 may be the same as or greater than the second thickness T2.

Subsequently, referring to FIGS. 1 and 3C, a second electrode 60 may be formed on the second B-metal oxide layer 24a. The second electrode 60 may be formed of a conductive material. A process temperature, which is required for a deposition process to form the second electrode 60, may cause the B-metal included in the second B-metal oxide layer 24a to diffuse into the third A-metal oxide layer 22a to form a third diffusion region 22. The process temperature of the deposition process may cause that the third A-metal oxide layer 22a and the second B-metal oxide layer 24a are changed into a crystalline state. In addition, a portion of the second B-metal oxide layer 24a may be changed into a second B-metal region 24. As a result, a second dielectric layer 30 may be finally formed.

A method of fabricating a semiconductor memory device according to some example embodiments of the present inventive concepts may include the annealing process (the fourth step, S41) performed between the deposition step (the third step, S31) for the second A-metal oxide layer 20a and the deposition step (the fifth step, S51) for the third A-metal oxide layer 22a, and thus the surface roughness of the second surface 30b of the second dielectric layer 30 may be reduced compared with a case where no annealing process is performed. Accordingly, the dielectric layer 40 may decrease in leakage current.

Although not shown, an additional annealing process for forming the third diffusion region 22 may be performed between the deposition step (the sixth step, S61) for the second B-metal oxide layer 24a and the formation step for the second electrode 60. An additional annealing process may also be performed between the deposition step (the second step, S21) for the first B-metal oxide layer 16a and the deposition step (the third step, S31) for the second A-metal oxide layer 20a. The first to sixth steps S11 to S61 may constitute a single cycle, and the single cycle may be repeatedly performed several times. In conclusion, the second dielectric layer 30 may be formed to have a desired thickness.

Figure 2B:
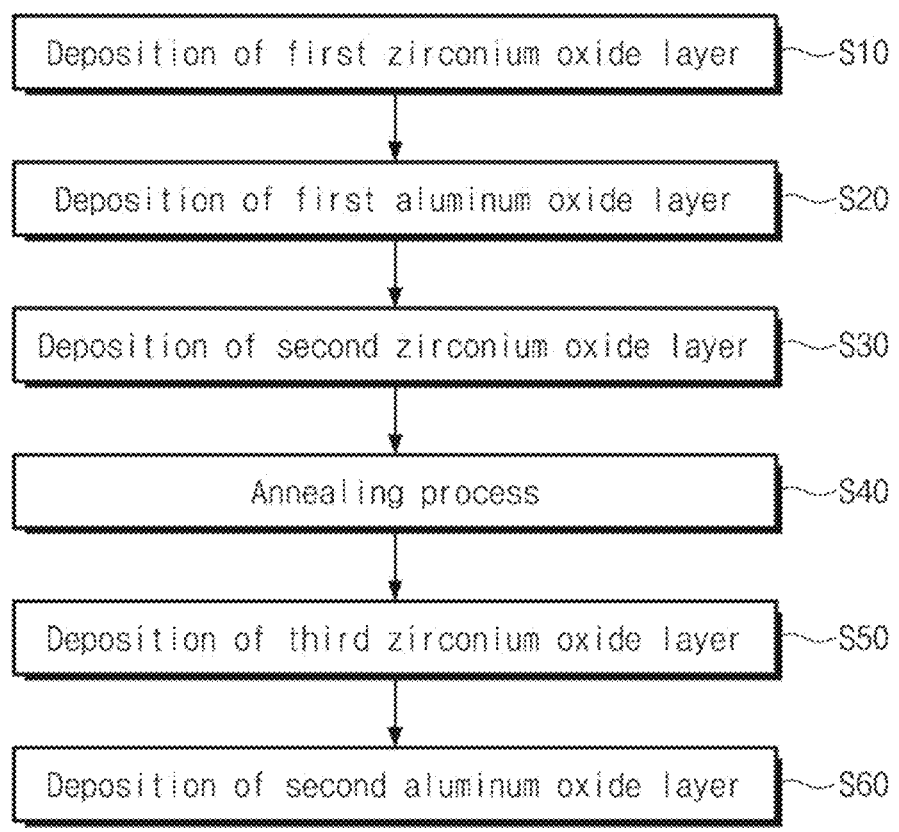
FIG. 2B is a flow chart showing a method of fabricating a semiconductor memory device according to some example embodiments of the present inventive concepts.

FIG. 2B is a flow chart showing a method of fabricating a semiconductor memory device according to some example embodiments of the present inventive concepts. FIG. 2B shows an example in which the A-metal is zirconium and the B-metal is aluminum.

Referring to FIGS. 2B and 3A, a first electrode 50 and a first dielectric layer 10 may be formed on a substrate 1. A first zirconium oxide layer 12a in an amorphous state may be deposited to have a first thickness T1 on the first dielectric layer 10 (S10). A first aluminum oxide layer 16a in an amorphous state may be deposited to have a second thickness T2 on the first zirconium oxide layer 12a (S20). A second zirconium oxide layer 20a in an amorphous state may be deposited to have a third thickness T3 on the first aluminum oxide layer 16a (S30). A relationship between the first, second, and third thicknesses T1, T2, and T3 may be the same as that discussed above.

Referring to FIGS. 2B and 3B, an annealing process may be performed (S40). Therefore, aluminum atoms contained in the first aluminum oxide layer 16a may diffuse into the first and second zirconium oxide layers 12a and 20a to form first and second diffusion regions 14 and 18. In addition, there may be formed first and second zirconium regions 12 and 20 and a first aluminum region 16. As a result, a second preliminary dielectric layer 25 may be formed and have a crystalline state.

Referring to FIGS. 2B and 3C, a third zirconium oxide layer 22a in an amorphous state may be formed to have a fourth thickness T4 on the second preliminary dielectric layer 25 (S50). A second aluminum oxide layer 24a may be formed to have a fifth thickness T5 on the third zirconium oxide layer 22a. As shown in FIG. 1, a second electrode 60 may be formed on the second aluminum oxide layer 24a. Detailed process steps and structural changes may be identical or similar to those discussed with reference to FIG. 2A.

Figure 4:
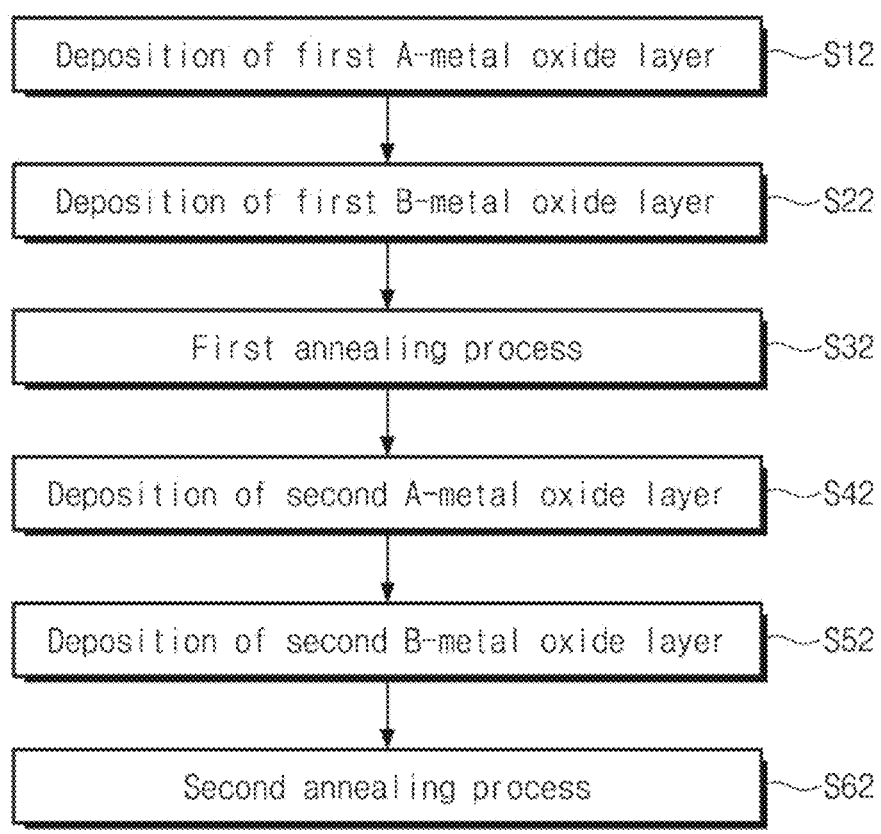
FIG. 4 is a flow chart showing a method of fabricating a semiconductor memory device according to some example embodiments of the present inventive concepts.

FIG. 4 is a flow chart showing a method of fabricating a semiconductor memory device according to some example embodiments of the present inventive concepts. FIGS. 5A to 5D illustrate cross-sectional views showing a method of fabricating a semiconductor memory device according to some example embodiments of the present inventive concepts.

Figure 5A:
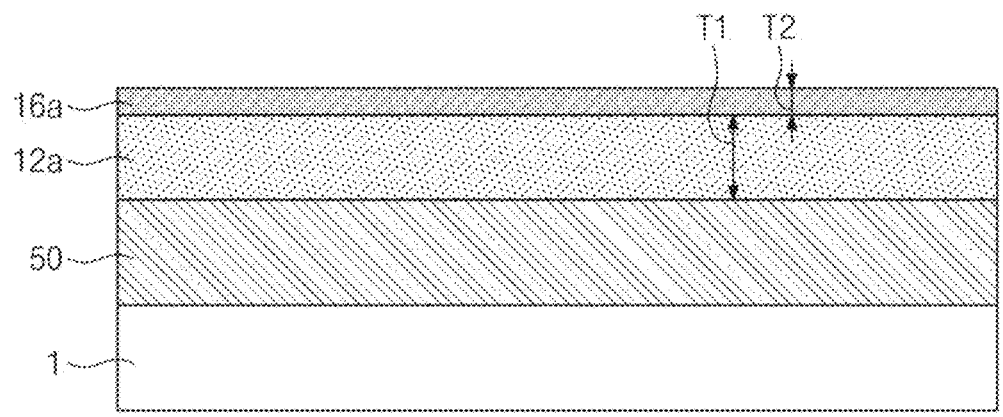
FIGS. 5A to 5D illustrate cross-sectional views showing a method of fabricating a semiconductor memory device according to some example embodiments of the present inventive concepts.

Referring to FIGS. 4 and 5A, a first electrode 50 may be formed on a substrate 1. A first A-metal oxide layer 12a may be deposited to have a first thickness T1 on the first electrode 50 (a first step, S12). For example, the first A-metal oxide layer 12a may be a zirconium oxide layer or a hafnium oxide layer. The first A-metal oxide layer 12a may be deposited in an amorphous state. A first B-metal oxide layer 16a may be deposited to have a second thickness T2 on the first A-metal oxide layer 12a (a second step, S22). The second thickness T2 may be less than the first thickness T1. The first B-metal oxide layer 16a may be deposited in an amorphous state. For example, the first B-metal oxide layer 16a may be an aluminum oxide layer or a niobium oxide layer. Although not shown in FIG. 5A, before the first A-metal oxide layer 12a is formed, a first dielectric layer 10 of FIG. 3A may be formed on the first electrode 50.

Figure 5B:
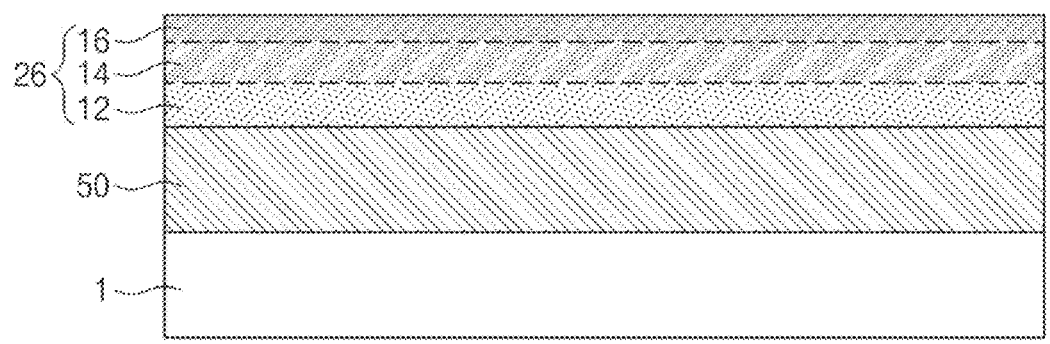

Referring to FIGS. 4 and 5B, a first annealing process may be performed (a third step, S32). Thus, the B-metal contained in the first B-metal oxide layer 16a may diffuse into the first A-metal oxide layer 12a to form a first diffusion region 14. In addition, a portion of the first A-metal oxide layer 12a may be changed into a first A-metal region 12, and a portion of the first B-metal oxide layer 16a may be changed into a first B-metal region 16. Therefore, a preliminary dielectric layer 26 may be formed. One or more of oxygen, nitrogen, and argon may be supplied to perform the first annealing process at a temperature of 350° C. to 500° C. The temperature and time of the first annealing process may be controlled to generate a concentration gradient of the B-metal in the preliminary dielectric layer 26.

Figure 5C:
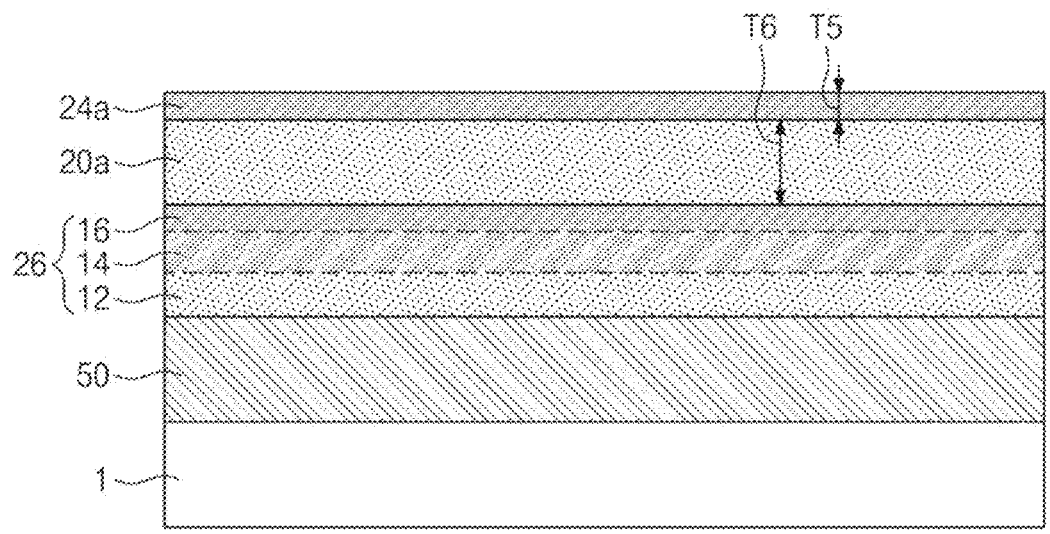

Referring to FIGS. 4 and 5C, a second A-metal oxide layer 20a may be deposited to have a sixth thickness T6 on the preliminary dielectric layer 26 (a fourth step, S42). The sixth thickness T6 may be greater than the second thickness T2. The sixth thickness T6 may be substantially the same as the first thickness T1. The sixth thickness T6 may be a sum of the third thickness T3 of FIG. 3A and the fourth thickness T4 of FIG. 3C. For example, the second A-metal oxide layer 20a may be, preferably, a zirconium oxide layer or a hafnium oxide layer. The second A-metal oxide layer 20a may be deposited in an amorphous state. A second B-metal oxide layer 24a may be deposited to have a fifth thickness T5 on the second A-metal oxide layer 20a (a fifth step, S52). The fifth thickness T5 may be less than the sixth thickness T6. The second B-metal oxide layer 24a may be deposited in an amorphous state. For example, the second B-metal oxide layer 24a may be an aluminum oxide layer or a niobium oxide layer.

Figure 5D:
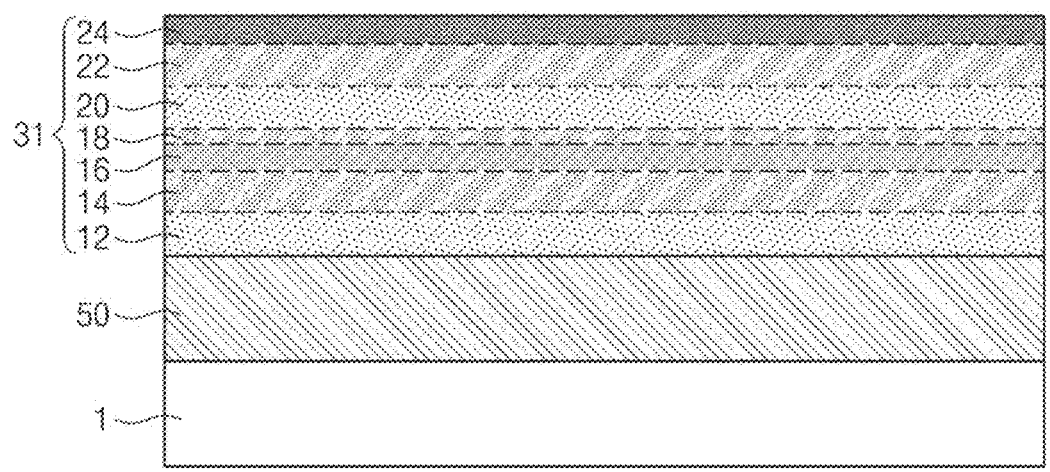

Referring to FIGS. 4 and 5D, a second annealing process may be performed (a sixth step, S62). Thus, the B-metal contained in the second B-metal oxide layer 24a may diffuse into the second A-metal oxide layer 20a to form a third diffusion region 22. In addition, the B-metal contained in the first B-metal region 16 may diffuse into the second A-metal oxide layer 20a to form a second diffusion region 18. A portion of the second A-metal oxide layer 20a may be changed into a second A-metal region 20, and a portion of the second B-metal oxide layer 24a may be changed into a second B-metal region 24. Therefore, a dielectric layer 31 may be formed. One or more of oxygen, nitrogen, and argon may be supplied to perform the second annealing process at a temperature of 350° C. to 500° C. The temperature and time of the second annealing process may be controlled to generate a concentration gradient of the B-metal in the dielectric layer 31. In the dielectric layer 31, the second diffusion region 18 may have a vertical width less than that of the first diffusion region 14 and that of the third diffusion region 22. Subsequently, a second electrode may be formed on the dielectric layer 31. In FIG. 5D, concentration gradients of the A-metal and the B-metal may be identical to concentration profiles shown in FIG. 1. In some embodiments, the second diffusion region 18 may have a thickness less than that of the first diffusion region 14 and that of the third diffusion region 22, as illustrated in FIG. 5D.

The first step S12 to the sixth step S62 of FIG. 4 may constitute a single cycle, and, in some embodiments, the single cycle may be repeatedly performed several times.

In some embodiments, the semiconductor memory device fabrication methods shown in FIGS. 2A, 2B, and 4 may be applicable to capacitor dielectric layers or to gate dielectric layers of gate patterns. For example, the dielectric layer 40 of FIG. 1 or the dielectric layer 31 of FIG. 5D may be a gate dielectric layer. In this case, the first electrode 50 may be omitted, and the second electrode 60 may correspond to a gate electrode.

Figure 6:
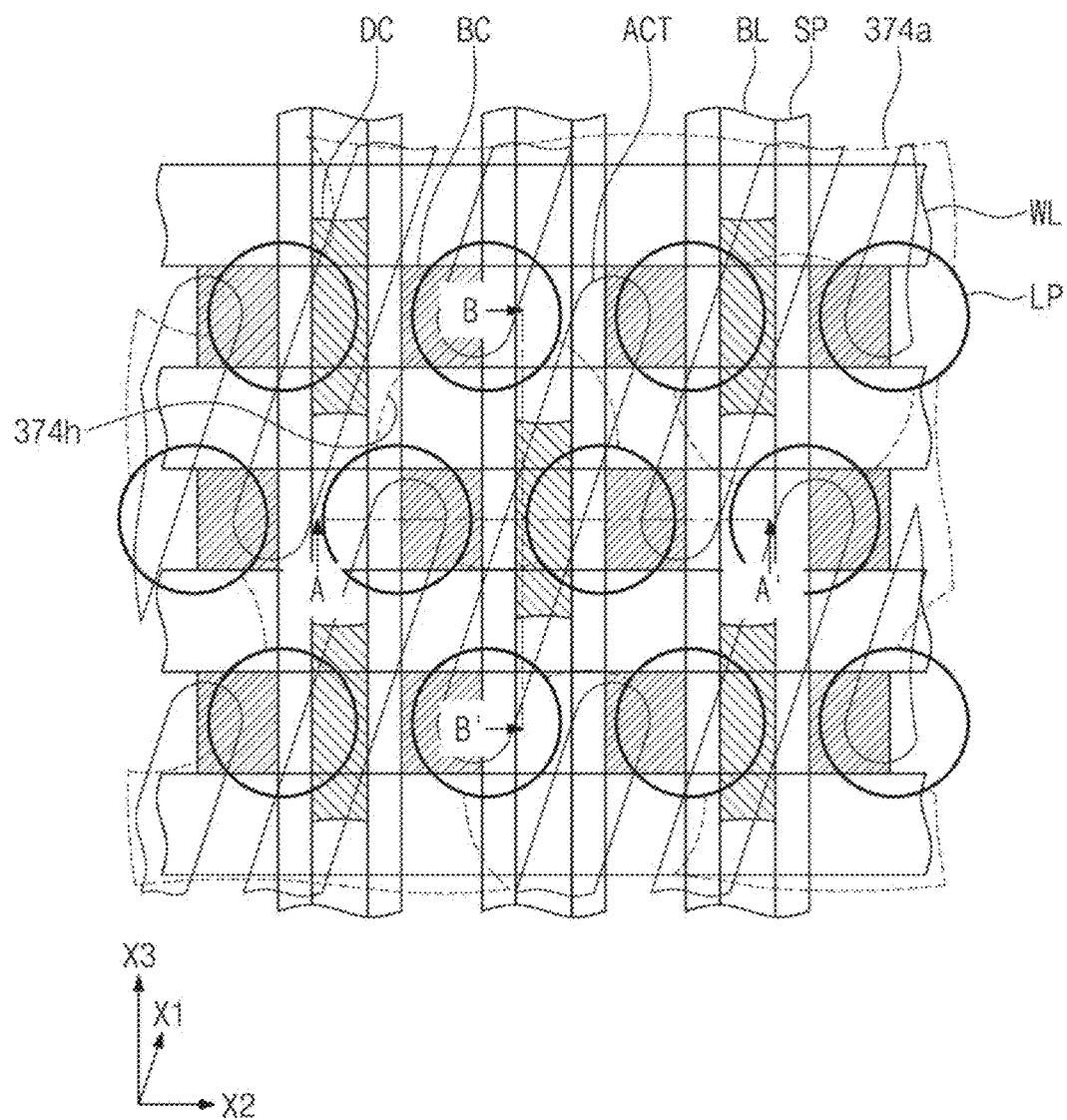
FIG. 6 illustrates a plan view showing a semiconductor memory device according to some example embodiments of the present inventive concepts.
Figure 7:
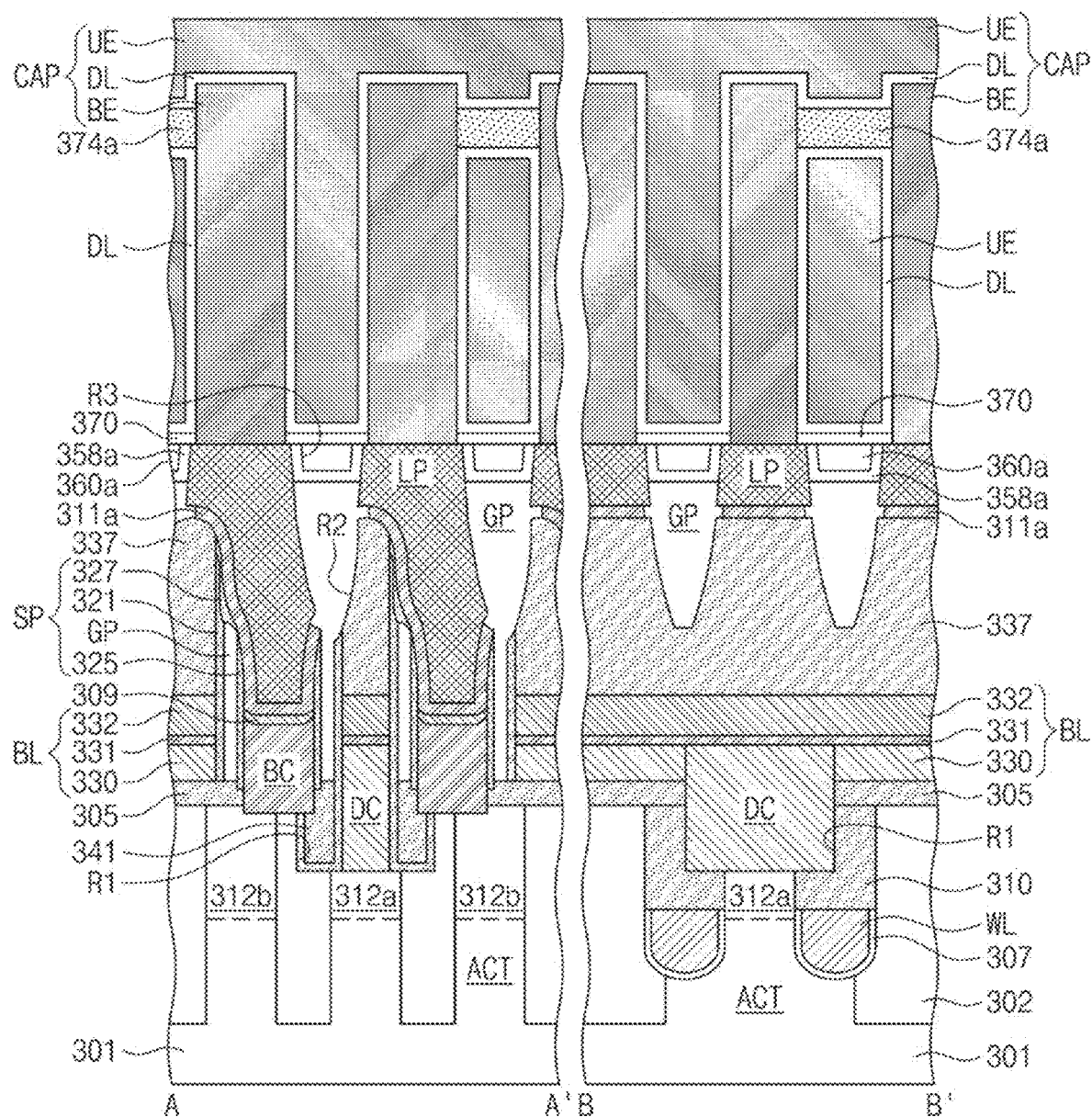
FIG. 7 illustrates a cross-sectional view taken along the line A-A' and the line B-B' of FIG. 6.

The following will describe a detailed example of a semiconductor memory device that includes a dielectric layer according to some example embodiments of the present inventive concepts. FIG. 6 illustrates a plan view showing a semiconductor memory device according to some example embodiments of the present inventive concepts. FIG. 7 illustrate a cross-sectional view taken along the lines A-A' and B-B' of FIG. 6.

Referring to FIGS. 6 and 7, a substrate 301 may be provided thereon with device isolation patterns 302 that define active sections ACT. Each of the active sections ACT may have an isolated shape. The active sections ACT may each have a bar shape elongated along a first direction X1 in a plan view. When viewed in plan, the active sections ACT may correspond to portions of the substrate 301 that are surrounded by the device isolation patterns 302. The substrate 301 may include a semiconductor material. The active sections ACT may be arranged parallel to each other in the first direction X1, such that one of the active sections ACT may have an end portion adjacent to a central portion of a neighboring one of the active sections ACT.

Word lines WL may run across the active sections ACT. The word lines WL may be disposed within grooves formed in the device isolation patterns 302 and the active sections ACT. The word lines WL may be parallel to a second direction X2 intersecting the first direction X1. The word lines WL may be formed of a conductive material. A gate dielectric layer 307 may be disposed between each of the word lines WL and an inner surface of each groove. Although not shown, the grooves may have their bottom surfaces located relatively deeper in the device isolation patterns 302 and relatively shallower in the active sections ACT. The gate dielectric layer 307 may include one or more of thermal oxide, silicon nitride, silicon oxynitride, and high-k dielectric. Each of the word lines WL may have a curved bottom surface.

A first doped region 312a may be disposed in the active section ACT between a pair of word lines WL, and a pair of second doped regions 312b may be disposed in opposite edge portions of the active section ACT. The first and second doped regions 312a and 312b may be doped with, for example, N-type impurities. The first doped region 312a may correspond to a common drain region, and the second doped regions 312b may correspond to source regions. A transistor may be constituted by each of the word lines WL and its adjacent first and second doped regions 312a and 312b. Because the word lines WL are disposed within the grooves, each of the word lines WL may have thereunder a channel region whose length becomes increased within a limited planar area. Accordingly, the short channel effect and the like may be reduced and possibly minimized.

The word lines WL may have top surfaces lower than those of the active sections ACT. A word line capping pattern 310 may be disposed on each of the word lines WL. The word line capping patterns 310 may have linear shapes extending along longitudinal directions of the word lines WL, and may cover entire top surfaces of the word lines WL. The grooves may have inner spaces not occupied by the word lines WL, and the word line capping patterns 310 may fill the unoccupied inner spaces of the grooves. The word line capping patterns 310 may be formed of, for example, a silicon nitride layer. It will be understood that "an element A covers an element B" (or similar language) as used herein means that the element A extends on the element B but does not necessarily mean that the element A covers the element B entirely.

An interlayer dielectric pattern 305 may be disposed on the substrate 301. The interlayer dielectric pattern 305 may be formed of a single or multiple layer including one or more selected from a silicon oxide layer, a silicon nitride layer, and a silicon oxynitride layer. The interlayer dielectric pattern 305 may be formed to have island shapes spaced apart from each other in a plan view. The interlayer dielectric pattern 305 may be formed to simultaneously cover end portions of two neighboring active sections ACT.

Top portions of the substrate 301, the device isolation pattern 302, and the word line capping pattern 310 may be partially recessed to form a first recess region R1. The first recess region R1 may have a net shape when viewed in plan as shown in FIG. 6. The first recess region R1 may have a sidewall aligned with that of the interlayer dielectric pattern 305.

Bit lines BL may be disposed on the interlayer dielectric pattern 305. The bit lines BL may run across the word line capping patterns 310 and the word lines WL. As shown in FIG. 6, the bit lines BL may be parallel to a third direction X3 intersecting the first and second directions X1 and X2. Each of the bit lines BL may include a bit line polysilicon pattern 330, a bit line ohmic pattern 331, and a bit line metal-containing pattern 332 that are sequentially stacked. The bit line polysilicon pattern 330 may include, for example, impurity-doped polysilicon or impurity-undoped polysilicon. The bit line ohmic pattern 331 may include, for example, a metal silicide layer. The bit line metal-containing pattern 332 may include, for example, one or more of metal (e.g., tungsten, titanium, or tantalum) and conductive metal nitride (e.g., titanium nitride, tantalum nitride, or tungsten nitride). A bit line capping pattern 337 may be disposed on each of the bit lines BL. The bit line capping patterns 337 may be formed of a dielectric material, such as a silicon nitride layer.

Bit line contacts DC may be disposed in the first recess region R1 intersecting the bit lines BL. The bit line contacts DC may include, for example, impurity-doped polysilicon or impurity-undoped polysilicon. When viewed in cross-section taken along the line B-B' of FIG. 6, the bit line contact DC may have a sidewall in contact with that of the interlayer dielectric pattern 305. When viewed in plan as shown in FIG. 6, the bit line contact DC may have a concave lateral surface in contact with the interlayer dielectric pattern 305. The bit line contact DC may electrically connect the first doped region 312a to the bit line BL.

The first recess region R1 may have an empty space not occupied by the bit line contact DC, and a lower buried dielectric pattern 341 may occupy the empty space of the first recess region R1. For example, the lower buried dielectric pattern 341 may be formed of a single or multiple layer including one or more selected from a silicon oxide layer, a silicon nitride layer, and a silicon oxynitride layer.

When viewed in plan, storage node contacts BC may be disposed between a pair of neighboring bit lines BL. The storage node contacts BC may be spaced apart from each other. The storage node contacts BC may include, for example, impurity-doped polysilicon or impurity-undoped polysilicon. In some embodiments, each of the storage node contacts BC may have a concave top surface as illustrated in FIG. 7. Between the bit lines BL, a dielectric pattern (not shown) may be disposed between the storage node contacts BC.

A bit line spacer SP may be interposed between the bit line BL and the storage node contact BC. The bit line spacer SP may include a first sub-spacer 321 and a second sub-spacer 325 that are spaced apart from each other across a gap region GP. The gap region GP may be an air gap. The first sub-spacer 321 may cover a sidewall of the bit line BL and a sidewall of the bit line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include a silicon nitride layer. In some embodiments, the gap region GP may be an empty space or a space including gas (e.g., air, nitrogen, argon, oxygen) therein.

The second sub-spacer 325 may have a bottom surface lower than that of the first sub-spacer 321. The second sub-spacer 325 may have a top end whose height (or level) is lower than that of a top end of the first sub-spacer 321. Such a configuration may increase a formation margin for landing pads LP which will be discussed below. As a result, disconnection may be reduced or possibly prevented between the landing pad LP and the storage node contact BC. The first sub-spacer 321 may extend to cover a sidewall of the bit line contact DC and also to cover a sidewall and a bottom surface of the first recess region R1. For example, the first sub-spacer 321 may be interposed between the bit line contact DC and the lower buried dielectric pattern 341, between the word line capping pattern 310 and the lower buried dielectric pattern 341, between the substrate 301 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include, for example, metal silicide. The storage node ohmic layer 309, the first and second sub-spacers 321 and 325, and the bit line capping pattern 337 may be conformally covered with a diffusion stop pattern 311a. The diffusion stop pattern 311a may include, for example, metal nitride, such as a titanium nitride layer or a tantalum nitride layer. A landing pad LP may be disposed on the diffusion stop pattern 311a. The landing pad LP may be formed of a material that contains metal, such as tungsten. The landing pad LP may have an upper portion that covers a top surface of the bit line capping pattern 337 and has a width greater than that of the storage node contact BC. A center of the landing pad LP may shift in the second direction X2 away from a center of the storage node contact BC. A portion of the bit line BL may be vertically overlapped by the landing pad LP. An upper sidewall of the bit line capping pattern 337 may be vertically overlapped by the landing pad LP, and may be covered with a third sub-spacer 327. A second recess region R2 may be formed on other upper sidewall of the bit line capping pattern 337. It will be understood that "an element A vertically overlapping an element B" (or similar language) as used herein means that at least one vertical line intersecting both the elements A and B exists. In some embodiments, the diffusion stop pattern 311a may have a uniform thickness along surfaces of the storage node ohmic layer 309, the first and second sub-spacers 321 and 325, and the bit line capping pattern 337 as illustrated in FIG. 7.

A first capping pattern 358a may cover and connect upper sidewalls of neighboring landing pads LP. The first capping pattern 358a may have a uniform thickness regardless of position. The first capping pattern 358a may define a third recess region R3 between the landing pads LP. The third recess region R3 may be filled with a second capping pattern 360a. The first and second capping patterns 358a and 360a may independently include a silicon nitride layer, a silicon oxide layer, a silicon oxynitride layer, or a porous layer. The first capping pattern 358a may have porosity greater than that of the second capping pattern 360a. The first and second capping patterns 358a and 360a may have top surfaces coplanar with those of the landing pads LP.

The gap region GP between the first and second sub-spacers 321 and 325 may extend into a space between the landing pads LP. The gap region GP may expose a bottom surface of the first capping pattern 358a. The gap region GP may extend toward the diffusion stop pattern 311a. For example, the diffusion stop pattern 311a may have a sidewall that is recessed between the landing pad LP and the bit line capping pattern 337. The gap region GP may partially expose a top surface of the bit line capping pattern 337 and a bottom surface of the landing pad LP.

Bottom electrodes BE may be disposed on corresponding landing pads LP. For example, the bottom electrode BE may include one or more of an impurity-doped polysilicon layer, a metal nitride layer such as a titanium nitride layer, and a metal layer such as a tungsten layer, an aluminum layer, and a copper layer. The bottom electrode BE may have a circular columnar shape, a hollow cylindrical shape, or a cup shape. Upper sidewalls of neighboring bottom electrodes BE may be connected to each other by a support pattern 374a. The support pattern 374a may include a dielectric material, such as a silicon nitride layer, a silicon oxide layer, and a silicon oxynitride layer. The support pattern 374a may include a support hole 374h. The support hole 374h may expose sidewalls of neighboring bottom electrodes BE.

Between the bottom electrodes BE, an etch stop layer 370 may cover the top surfaces of the first and second capping patterns 358a and 360a. The etch stop layer 370 may include a dielectric material, such as a silicon nitride layer, a silicon oxide layer, and a silicon oxynitride layer. A dielectric layer DL may cover surfaces of the bottom electrodes BE and a surface of the support pattern 374a. The dielectric layer DL may be the same as the dielectric layer 40 discussed with reference to FIG. 1 or the dielectric layer 31 discussed with reference to FIG. 5D. The dielectric layer DL may be covered with a top electrode UE. For example, the top electrode UE may include one or more of an impurity-doped polysilicon layer, an impurity-doped silicon-germanium layer, a metal nitride layer such as a titanium nitride layer, and a metal layer such as a tungsten layer, an aluminum layer, and a copper layer. A capacitor CAP may be constituted by the bottom electrode BE, the dielectric layer DL, and the top electrode UE.

A semiconductor memory device according to some example embodiments of the present inventive concepts may be configured such that the gap region GP may extend into a space between the landing pads LP, without being interrupted by upper portions of the first and second sub-spacers 321 and 325, and thus may be sufficiently provided between the first and second sub-spacers 321 and 325. Because air (gas or vacuum) has a lower dielectric constant than that of silicon oxide, the gap region GP may reduce a parasitic capacitance between the bit line BL and the storage node contact BC. In addition, a parasitic capacitance may be reduced between the landing pads LP. Further, the semiconductor memory device according to some example embodiments of the present inventive concepts may be configured to include the dielectric layer DL, and thus may have a reduced leakage current, a high dielectric constant, and excellent thermal stability. As a result, the semiconductor memory device may increase in reliability.

Figure 8A:
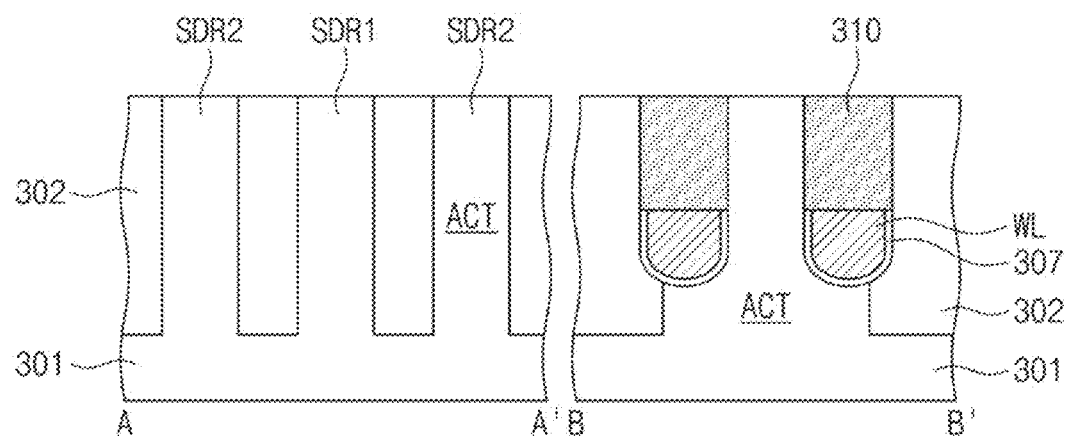
FIGS. 8A to 8Q illustrate cross-sectional views showing a method of fabricating a semiconductor memory device having the cross-section of FIG. 7, according to some example embodiments of the present inventive concepts.
Figure 8B:
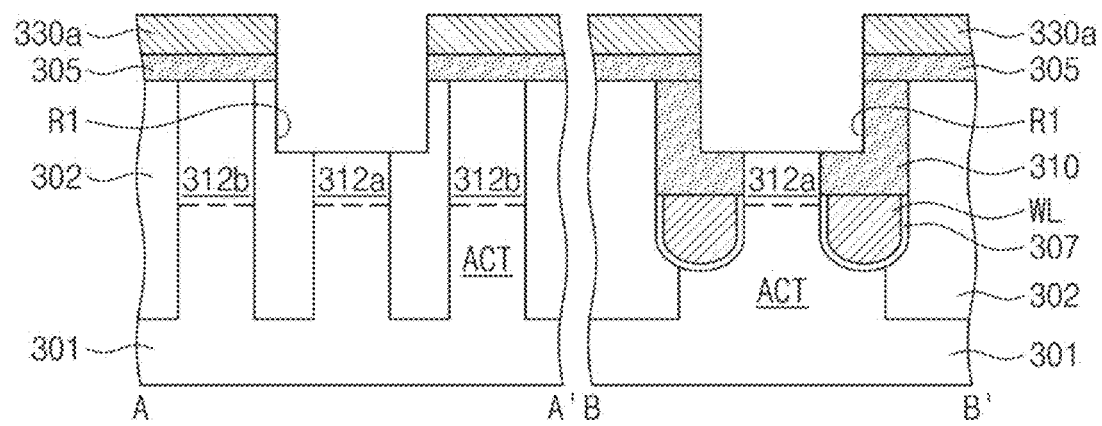
Figure 8C:
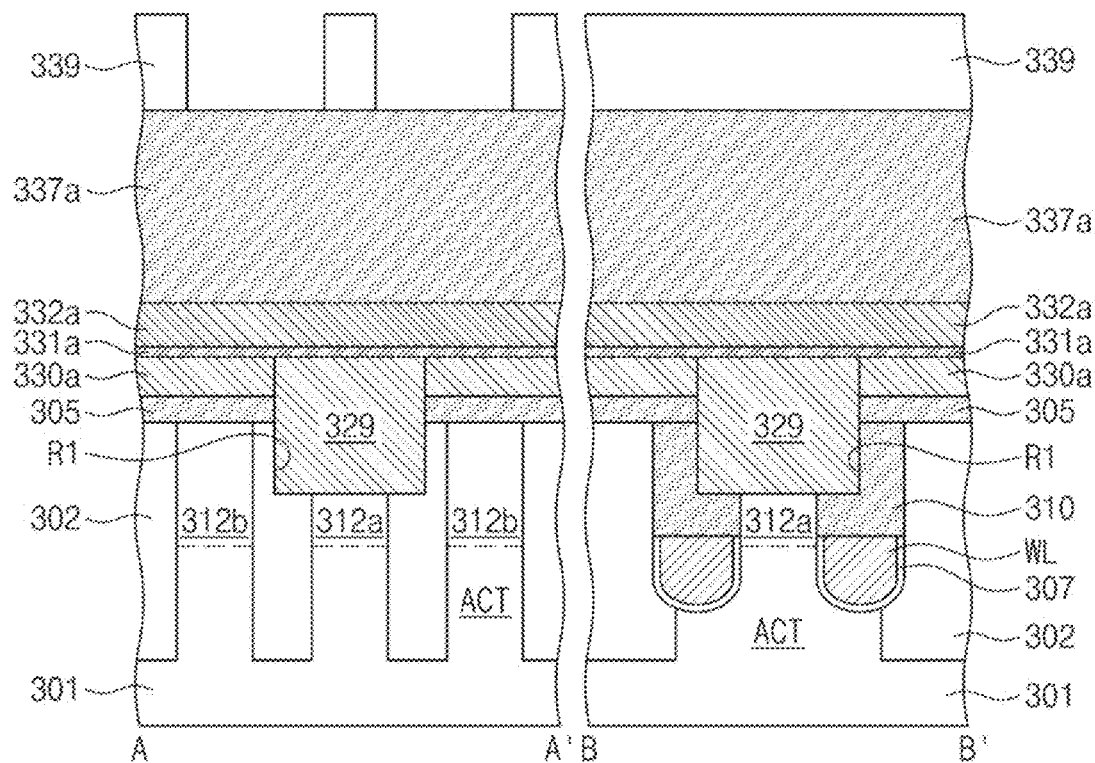
Figure 8D:
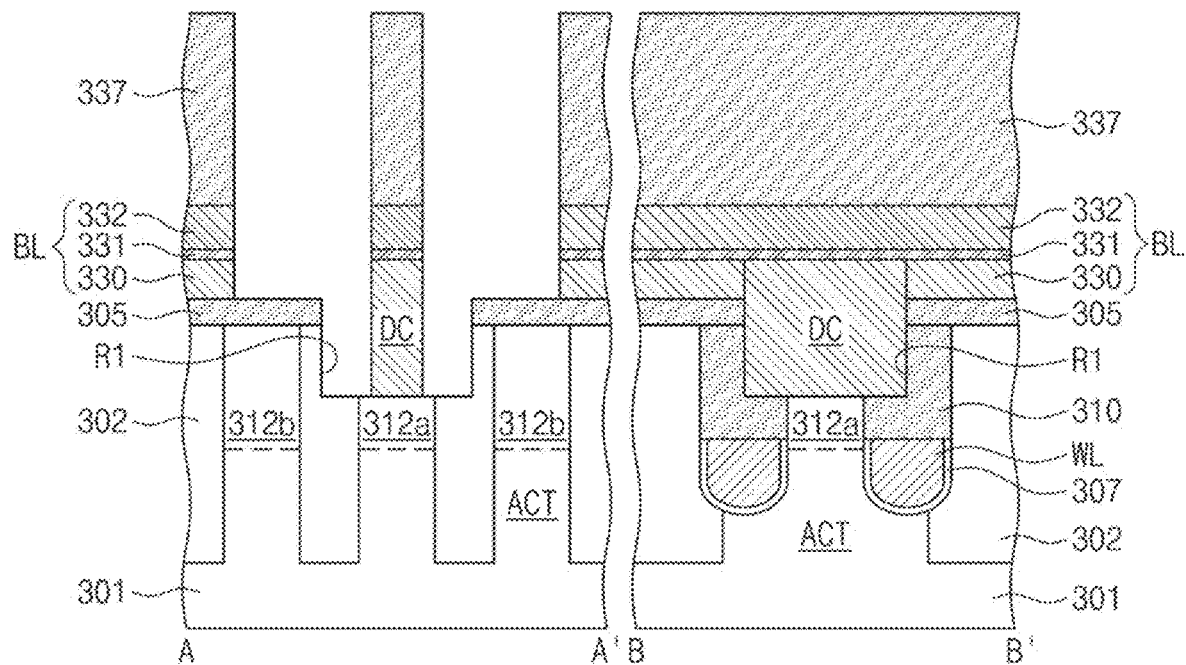
Figure 8E:
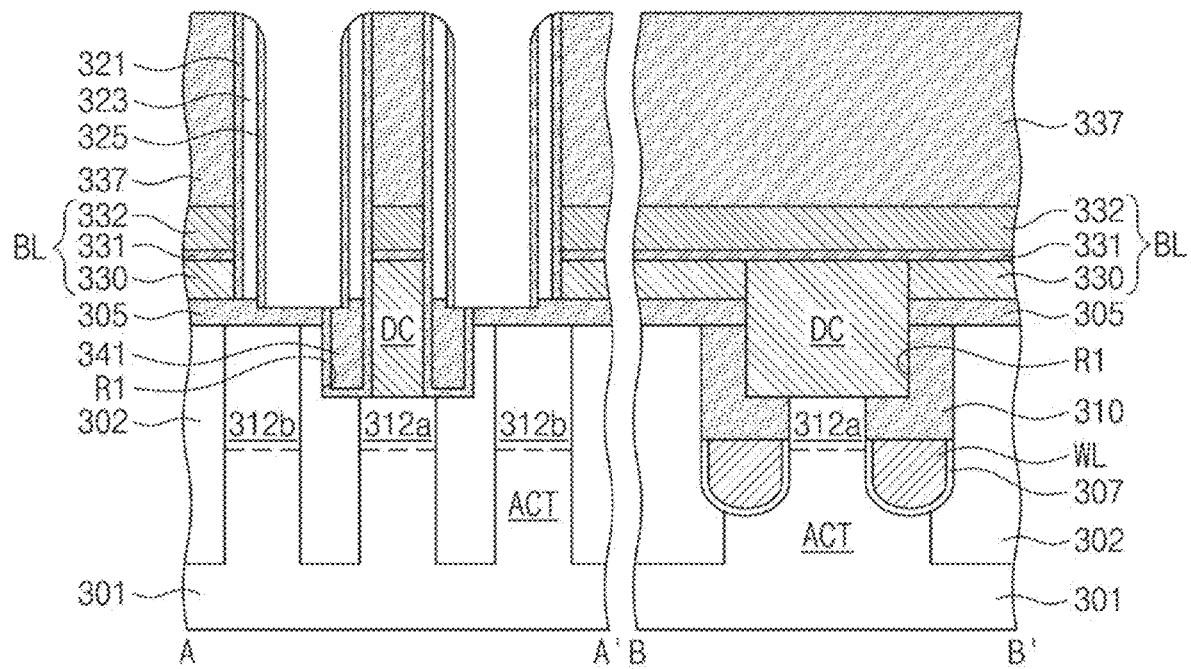
Figure 8F:
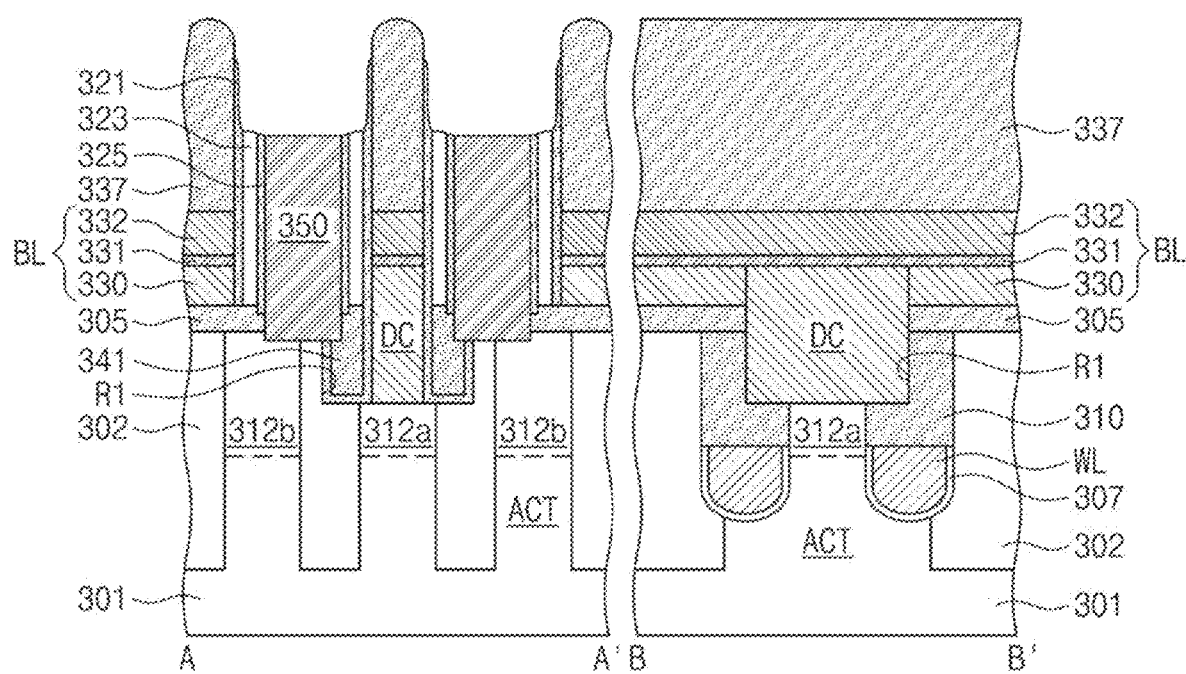
Figure 8G:
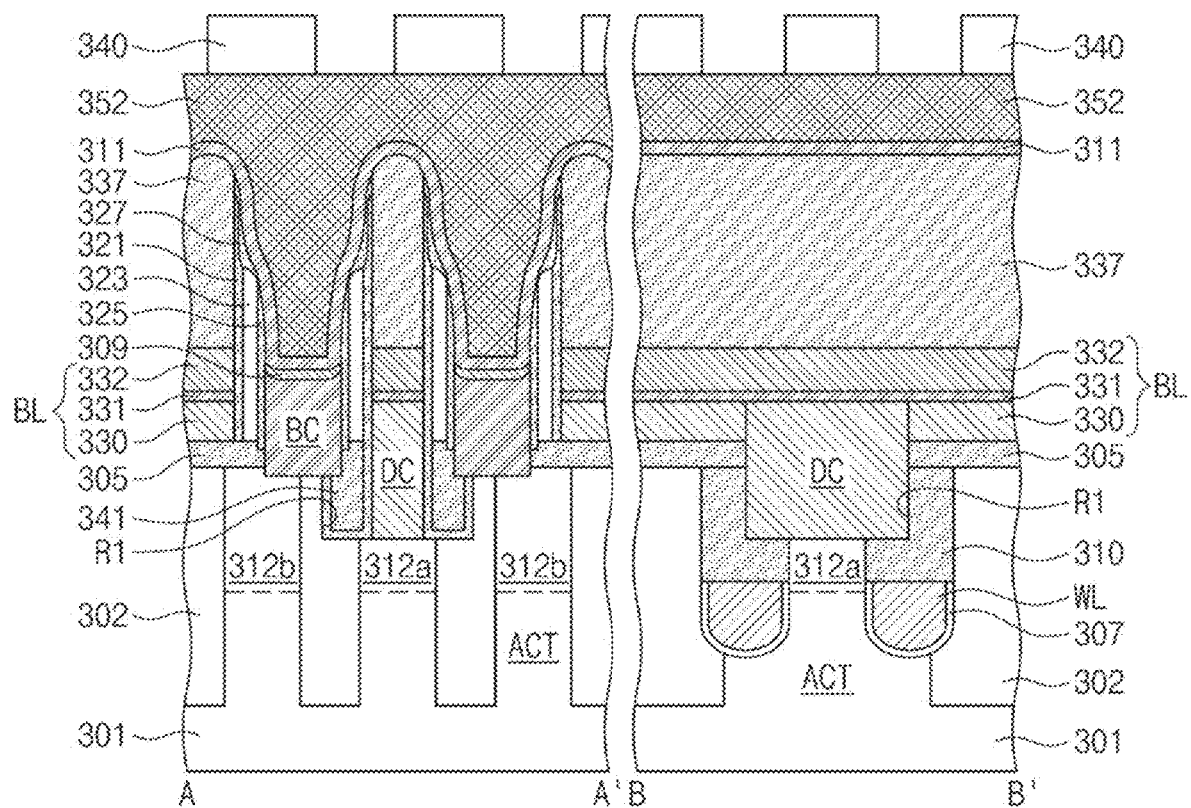
Figure 8H:
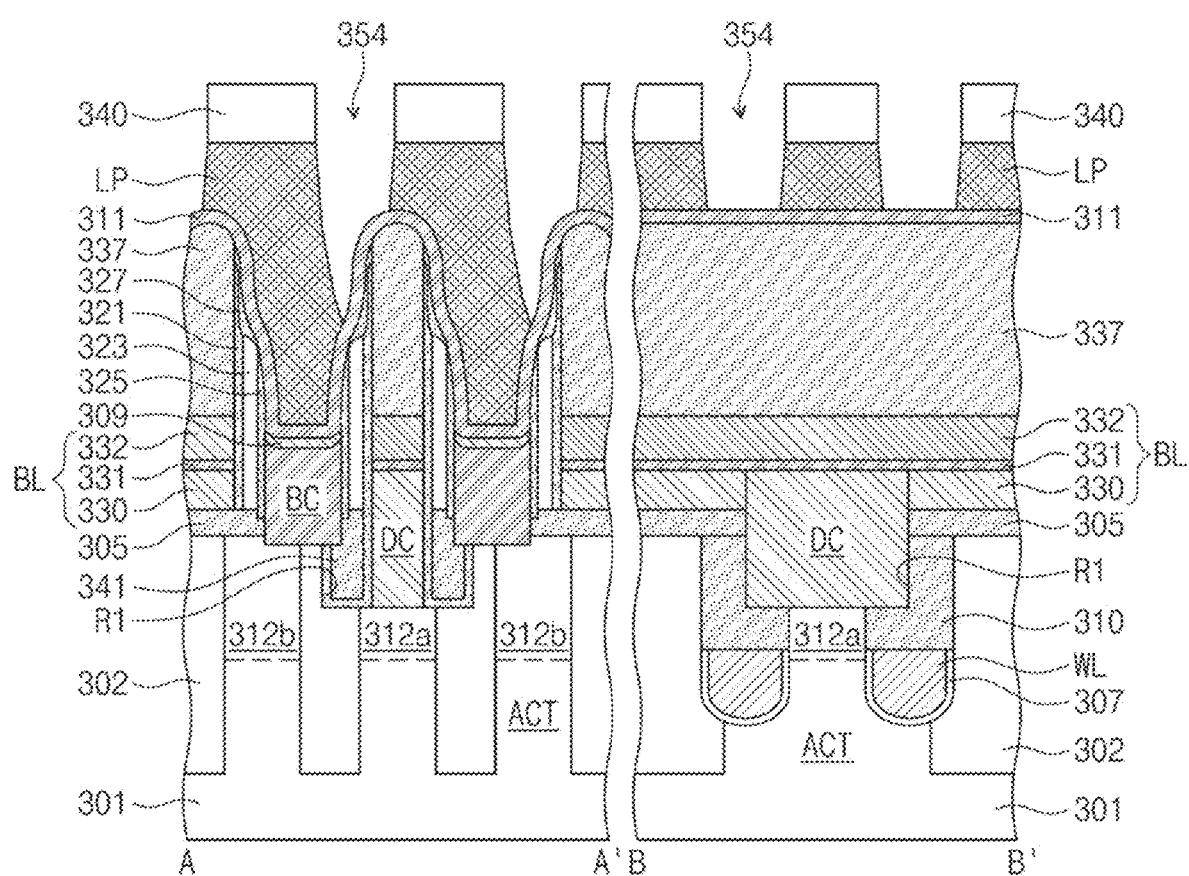
Figure 8I:
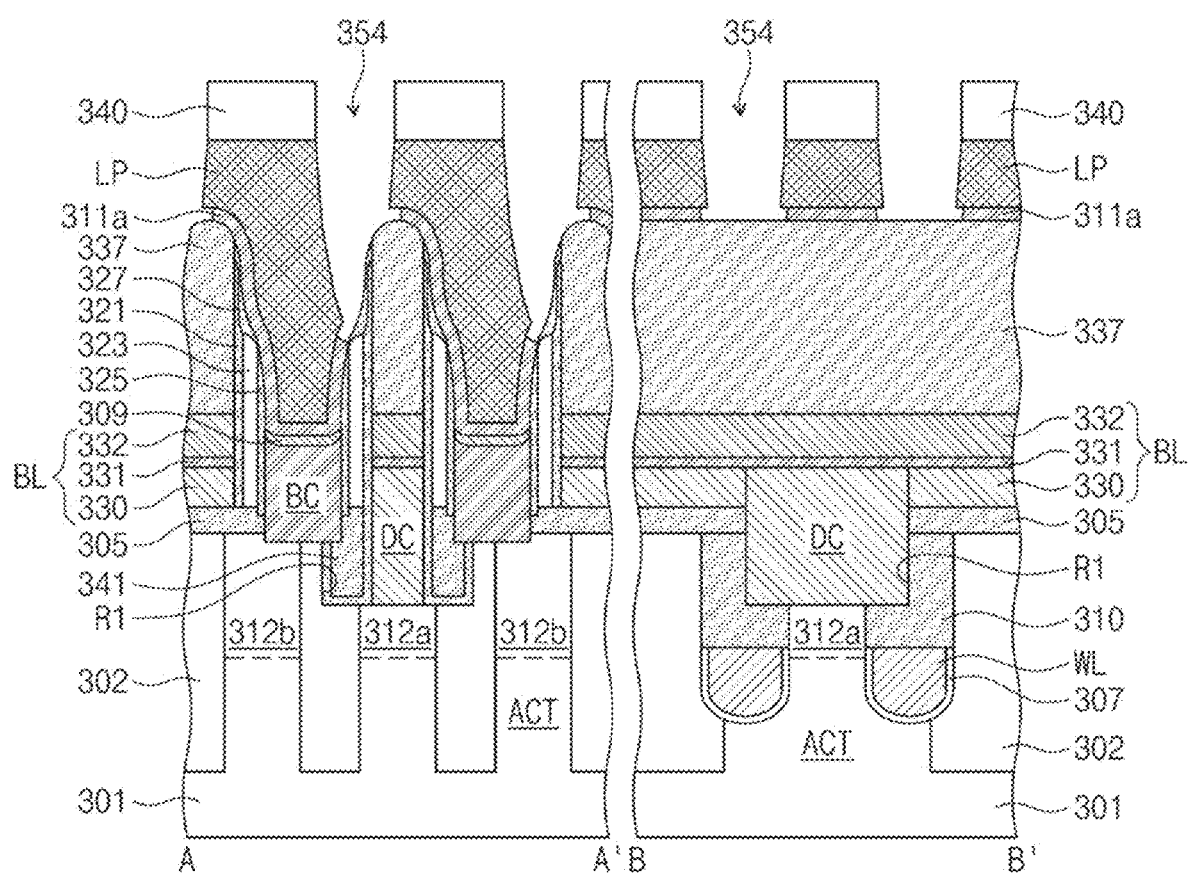
Figure 8J:
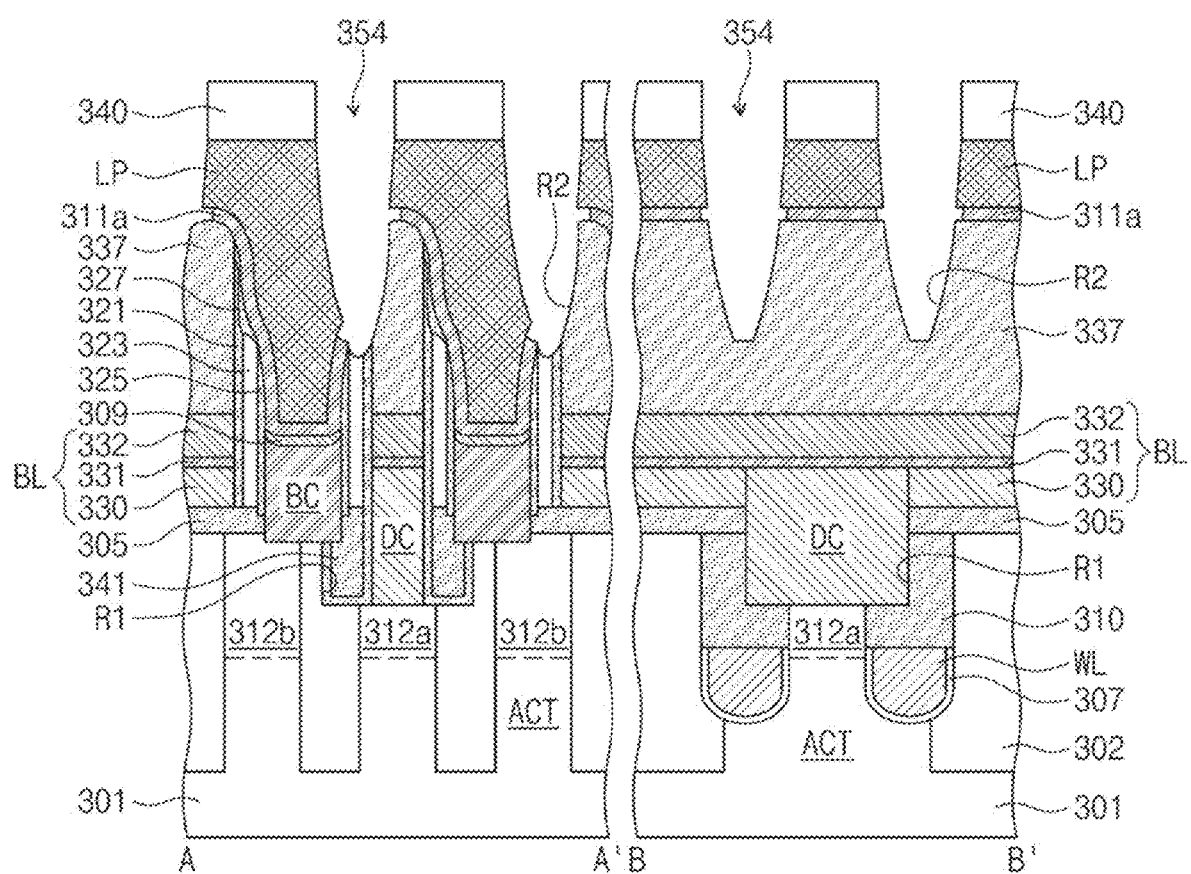
Figure 8K:
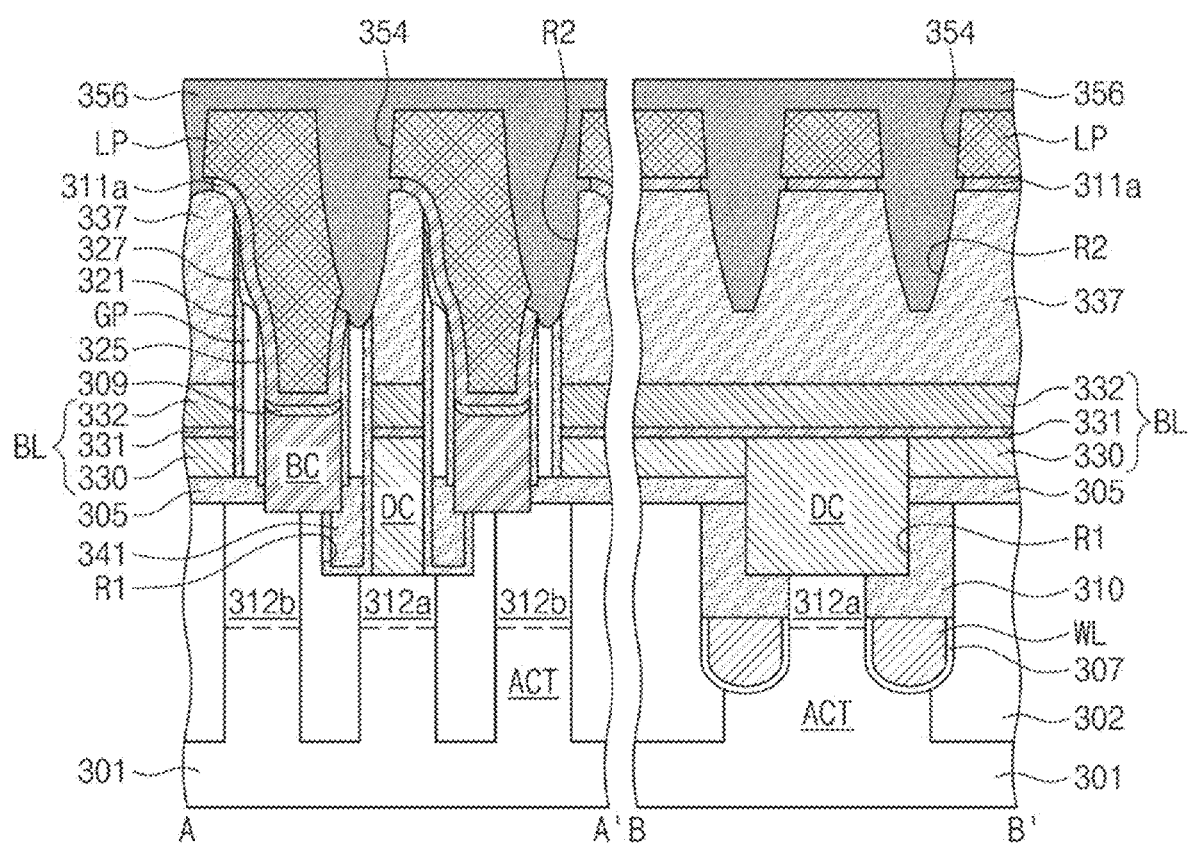
Figure 8L:
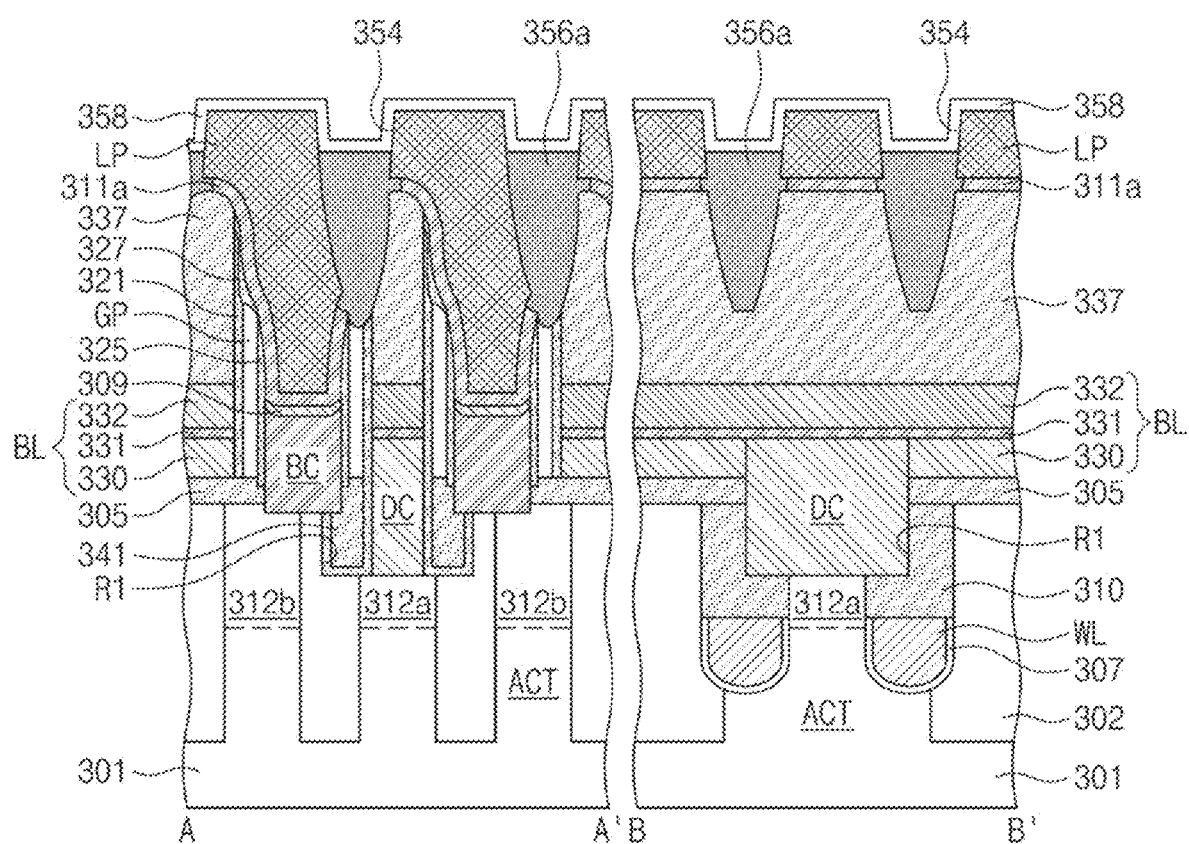
Figure 8M:
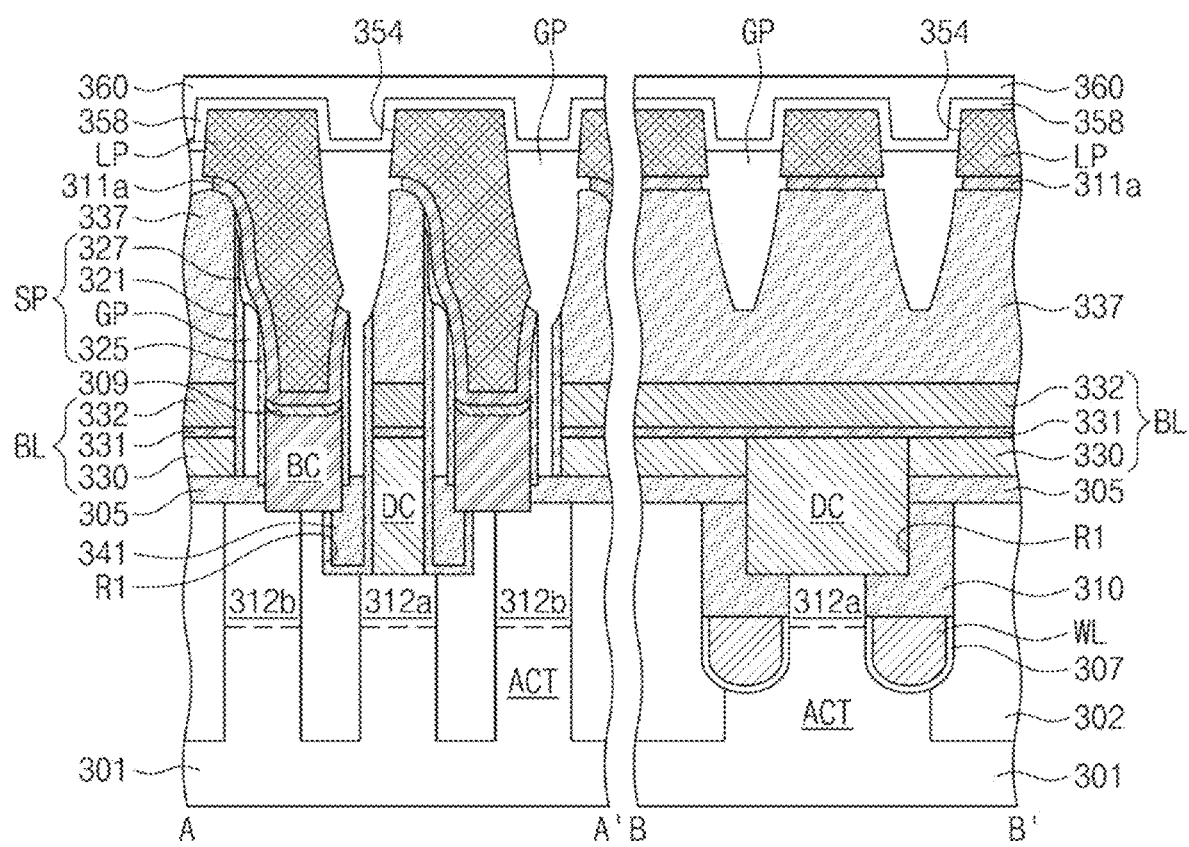
Figure 8N:
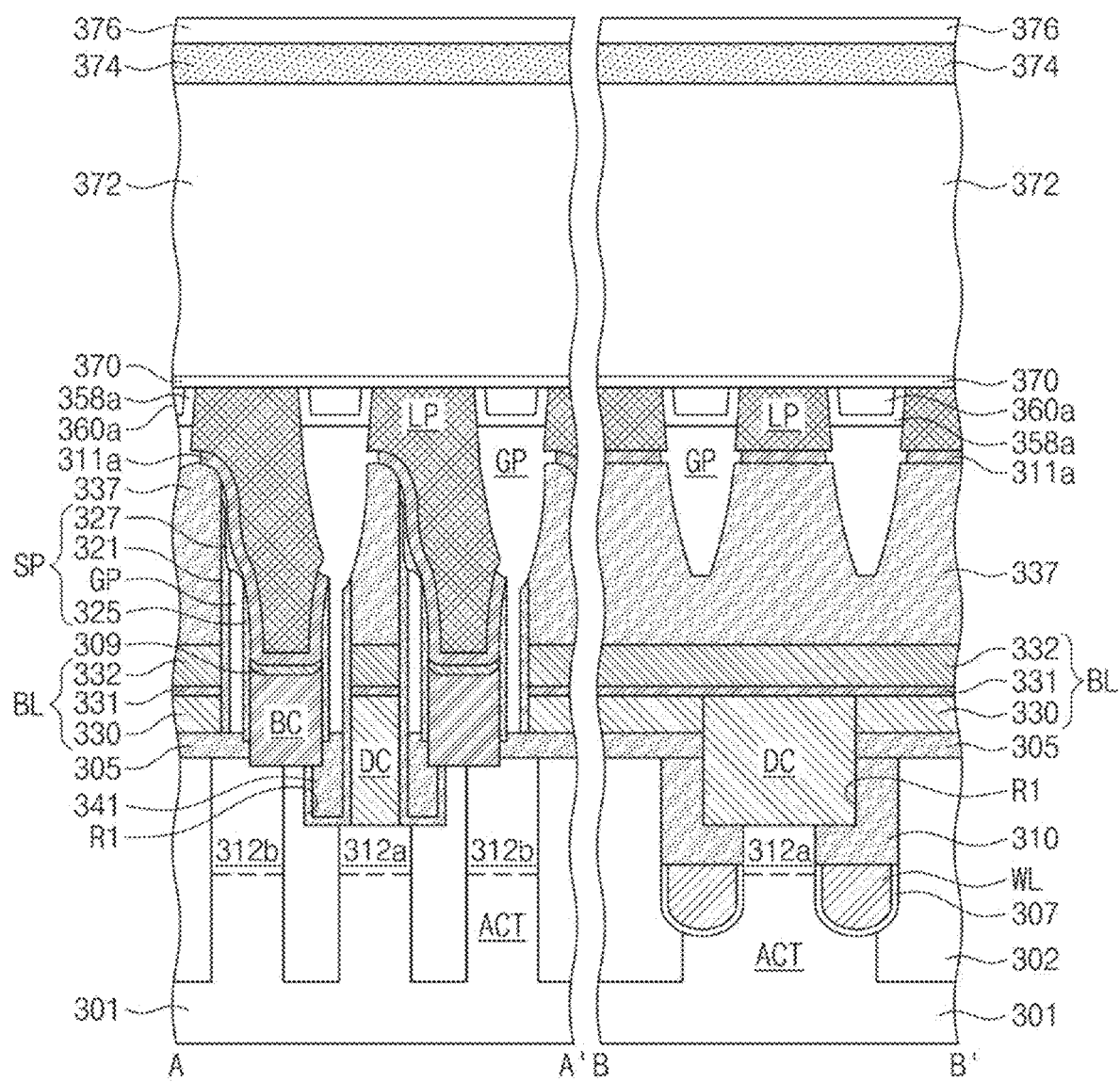
Figure 8O:
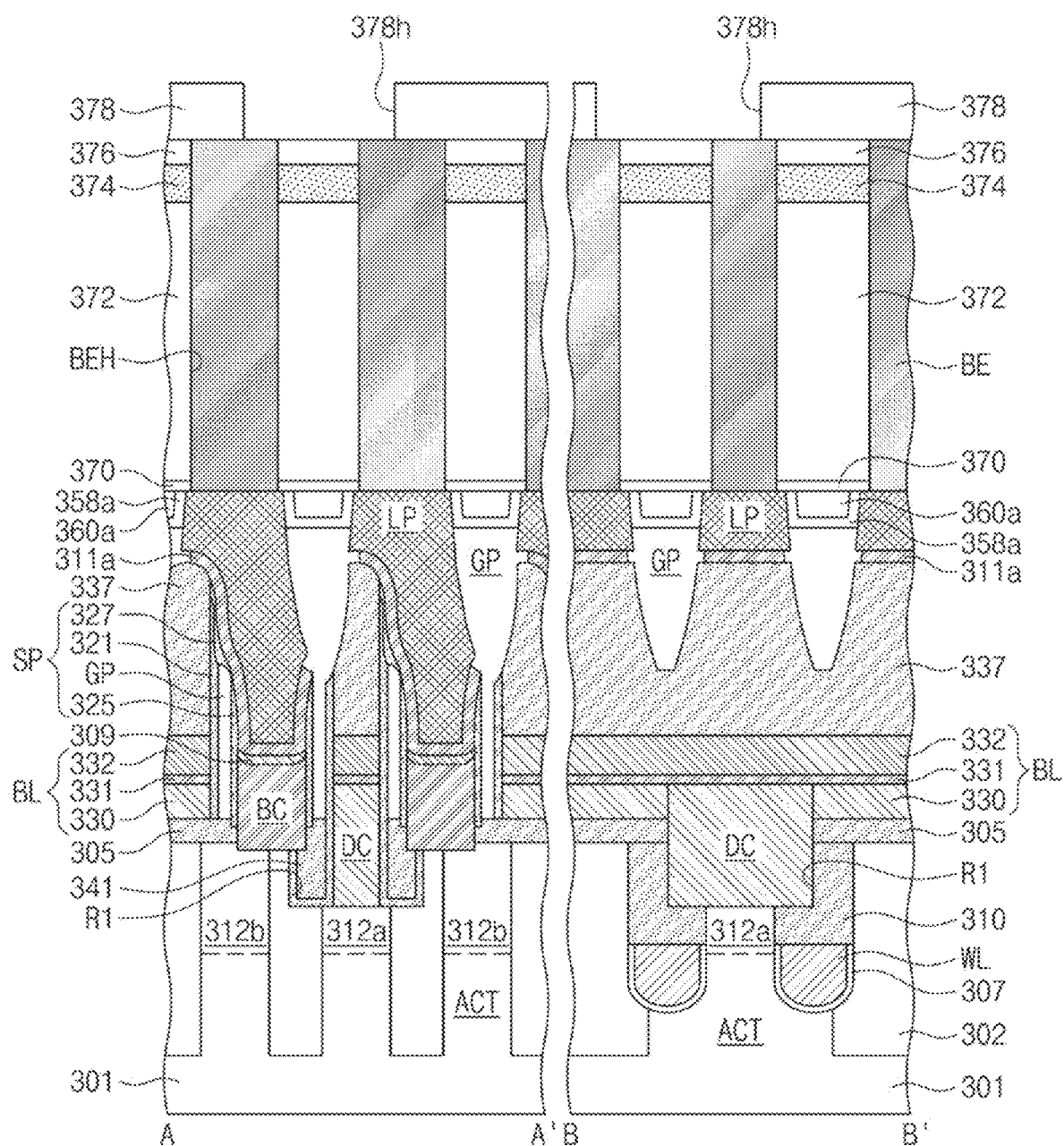
Figure 8P:
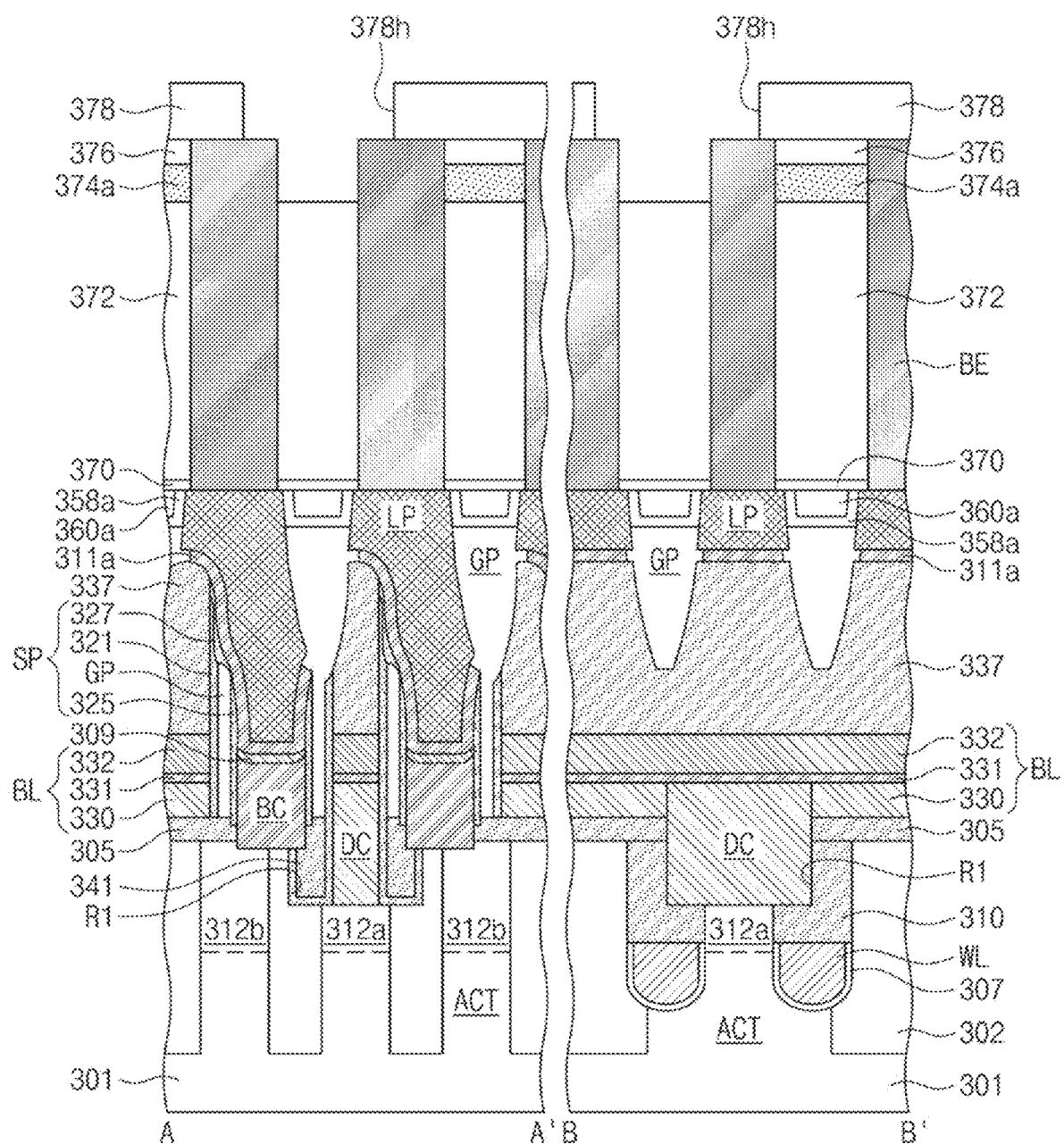
Figure 8Q:
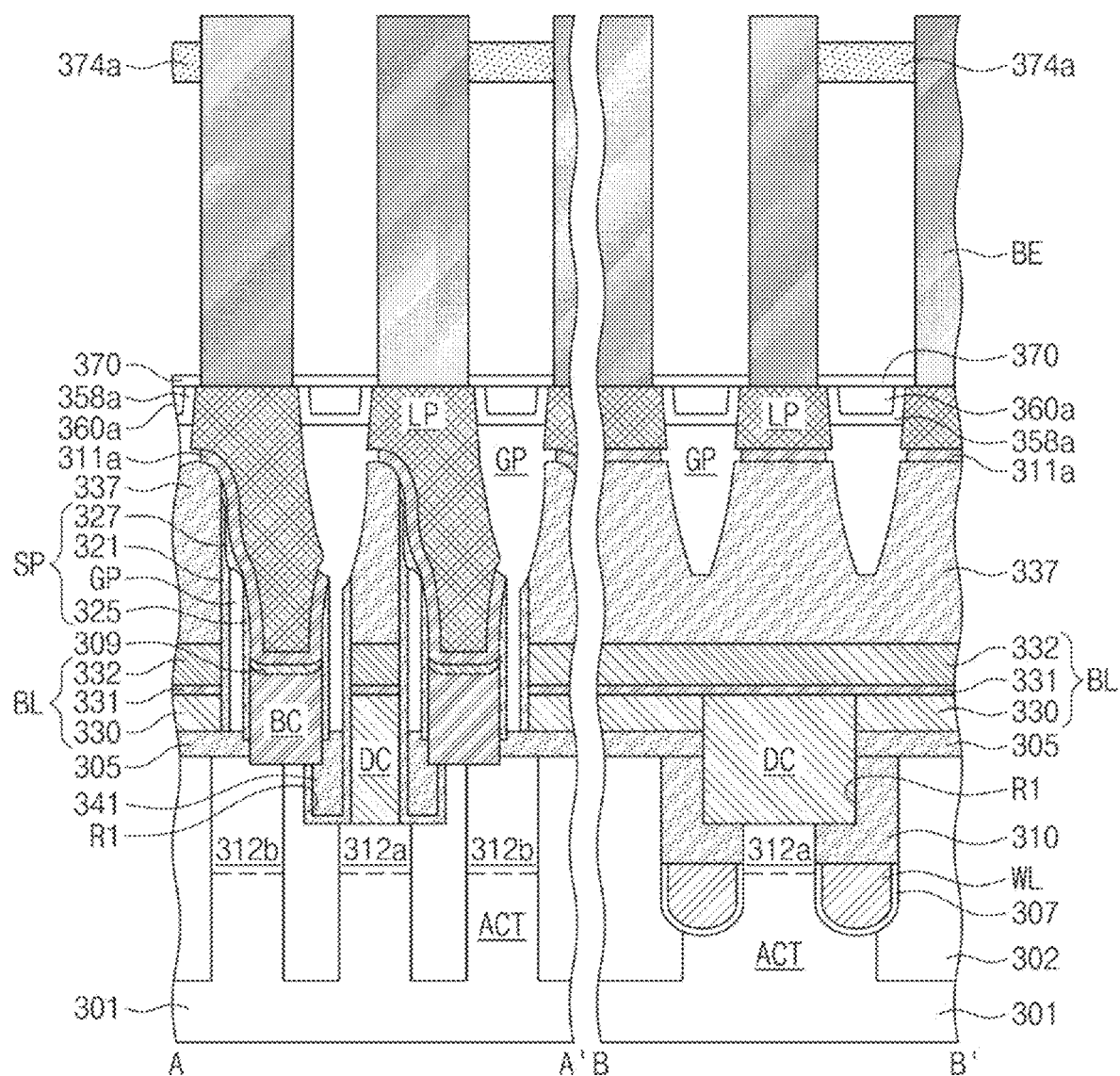

FIGS. 8A to 8Q illustrate cross-sectional views showing a method of fabricating a semiconductor memory device having the cross-section of FIG. 7, according to some example embodiments of the present inventive concepts.

Referring to FIG. 8A, device isolation patterns 302 may be formed on a substrate 301 to define active sections ACT. A device isolation trench may be formed on the substrate 301, and the device isolation patterns 302 may fill the device isolation trench. The active sections ACT and the device isolation patterns 302 may be patterned to form grooves. In this step, an etching condition for the substrate 301 and the device isolation patterns 302 may be properly controlled, such that the device isolation patterns 302 may be more easily etched than the substrate 301. Therefore, the grooves may have uneven bottom surfaces.

Word lines WL may be formed in corresponding grooves. A pair of word lines WL may run across each of the active sections ACT. As shown in FIG. 6, the pair of word lines WL may divide each of the active section ACT into a first source/drain region SDR1 and a pair of second source/drain regions SDR2. The first source/drain region SDR1 may be defined between the pair of word lines WL, and the pair of second source/drain regions SDR2 may be defined on opposite edges of each of the active sections ACT.

Before the word lines WL are formed, a gate dielectric layer 307 may be formed on an inner surface of the groove.

The gate dielectric layer 307 may be formed by a thermal oxidation process, a chemical vapor deposition process, and/or an atomic layer deposition process. A gate conductive layer may be formed to fill the grooves, and then etched-back to form the word lines WL. The word lines WL may have top surfaces that are recessed lower than those of the active sections ACT. A dielectric layer, such as a silicon nitride layer, may be formed on the substrate 301 so as to fill the grooves, and then etched to form word line capping patterns 310 on corresponding word lines WL. As used herein the term "and/or" includes any and all combinations of one or more of the associated listed items.

Referring to FIG. 8B, the word line capping patterns 310 and the device isolation patterns 302 may be used as a mask to dope impurities into the active sections ACT, which may form first and second doped regions 312a and 312b. The first doped region 312a and the second doped regions 312b may be formed respectively in the first source/drain region SDR1 and the second source/drain regions SDR2 shown in FIG. 8A. A dielectric layer and a first polysilicon layer may be sequentially formed on an entire top surface of the substrate 301. The first polysilicon layer may be patterned to form a polysilicon mask pattern 330a. The polysilicon mask pattern 330a may be used as an etching mask to etch the dielectric layer, the device isolation pattern 302, the substrate 301, and the word line capping pattern 310 to simultaneously form a first recess region R1 and an interlayer dielectric pattern 305. The interlayer dielectric pattern 305 may be formed to have a plurality of island shapes that are spaced apart from each other. The interlayer dielectric pattern 305 may be formed to cover both end portions of two neighboring active sections ACT. The first recess region R1 may be formed to have a net shape in a plan view. The first recess region R1 may expose the first doped regions 312a. It will be understood that "formed simultaneously" refers to being formed in a same fabrication step, at approximately (but not necessarily exactly) the same time.

Referring to FIG. 8C, a second polysilicon layer 329 may be formed on the entire surface of the substrate 301, such that the first recess region R1 may be filled with the second polysilicon layer 329. The second polysilicon layer 329 may undergo a planarization etching process to remove the second polysilicon layer 329 on the polysilicon mask pattern 330a and to expose a top surface of the polysilicon mask pattern 330a. A bit line ohmic layer 331a, a bit line metal-containing layer 332a, and a bit line capping layer 337a may be sequentially formed on the polysilicon mask pattern 330a and the second polysilicon layer 329. The bit line ohmic layer 331a may be formed of, for example, metal silicide, such as cobalt silicide. The bit line ohmic layer 331a may be formed by depositing a metal layer on the polysilicon mask pattern 330a and the second polysilicon layer 329, performing an annealing process to form metal silicide by reacting the metal layer with polysilicon of the polysilicon mask pattern 330a and the second polysilicon layer 329, and then removing a non-reacted metal layer.

First mask patterns 339 may be formed on the bit line capping layer 337a, and may define planar shapes of bit lines BL which will be discussed below. The first mask patterns 339 may extend in a third direction X3 intersecting both of first and second directions X1 and X2 shown in FIG. 6.

Referring to FIG. 8D, the first mask patterns 339 may be used as an etching mask to perform an etching process in which the bit line capping layer 337a, the bit line metal-containing layer 332a, the bit line ohmic layer 331a, the polysilicon mask pattern 330a, and the second polysilicon layer 329 are sequentially etched to form a bit line capping pattern 337, a bit line contact DC, and a bit line BL that includes a bit line polysilicon pattern 330, a bit line ohmic pattern 331, and a bit line metal-containing pattern 332. The etching process may partially expose a top surface of the interlayer dielectric pattern 305, and also partially expose an inner sidewall and a bottom surface of the first recess region R1. The first mask patterns 339 may then be removed.

Referring to FIG. 8E, a first sub-spacer layer may be conformally formed on the entire surface of the substrate 301. The first sub-spacer layer may conformally cover the bottom surface and the inner sidewall of the first recess region R1. The first sub-spacer layer may be, for example, a silicon nitride layer. A dielectric layer, such as a silicon nitride layer, may be formed on the entire surface of the substrate 301 so as to fill the first recess region R1, and then anisotropically etched to leave a lower buried dielectric pattern 341 in the first recess region R1. When the anisotropic etching process is performed, the first sub-spacer layer may also be etched to form a first sub-spacer 321. The anisotropic etching process may also expose the top surface of the interlayer dielectric pattern 305. A sacrificial spacer layer may be conformally formed on the entire surface of the substrate 301, and then anisotropically etched to form a sacrificial spacer 323 that covers a sidewall of the first sub-spacer 321. The sacrificial spacer 323 may include a material having an etch selectivity with respect to the first sub-spacer 321. The sacrificial spacer 323 may be formed of, for example, a silicon oxide layer. A second sub-spacer 325 may be formed to cover a sidewall of the sacrificial spacer 323. The second sub-spacer 325 may be formed of, for example, a silicon nitride layer. After the second sub-spacer 325 is formed, the top surface of the interlayer dielectric pattern 305 may be exposed.

Referring to FIGS. 8E and 8F, a polysilicon layer may be formed on the entire surface of the substrate 301 to fill a space between the bit lines BL, and then etched to form a preliminary storage node contact 350 and to expose upper sidewalls of the first sub-spacer 321, the sacrificial spacer 323, and the second sub-spacer 325. Upper portions of the sacrificial spacer 323 and the second sub-spacer 325 may be removed to cause the sacrificial spacer 323 and the second sub-spacer 325 to have top ends whose heights (or levels) are similar to that of a top surface of the preliminary storage node contact 350. Therefore, the upper sidewall of the first sub-spacer 321 may be exposed. This process may provide a large process margin for forming landing pads LP which will be discussed below. When the upper portions of the sacrificial spacer 323 and the second sub-spacer 325 are removed, an upper portion of the first sub-spacer 321 may also be partially removed and thus the first sub-spacer 321 may have a reduced width at the upper portion thereof.

Referring to FIGS. 8F and 8G, a third sub-spacer layer may be conformally formed on the entire surface of the substrate 301, and then anisotropically etched to form a third sub-spacer 327 that covers the exposed upper sidewall of the first sub-spacer 321. The third sub-spacer 327 may have a lower portion that covers an exposed top end of the sacrificial spacer 323. The preliminary storage node contact 350 may be etched to expose an upper sidewall of the second sub-spacer 325 and simultaneously to form a storage node contact BC. The third sub-spacer 327 may complement a damaged upper portion of the first sub-spacer 321 and may cover the sacrificial spacer 323, thereby serving to reduce or possibly prevent the bit line BL from being attacked by an etchant used for etching the storage node contact BC and a cleaning solution used in a subsequent cleaning process. As a result, the bit line BL may be protected from damages.

A storage node ohmic layer 309 may be formed on a top surface of the storage node contact BC. A diffusion stop layer 311 may be conformally formed on the entire surface of the substrate 301. A landing pad layer 352 may be formed on the entire surface of the substrate 301, and may fill spaces between the bit line capping patterns 337. The landing pad layer 352 may include, for example, tungsten. Second mask patterns 340 may be formed on the landing pad layer 352. The second mask patterns 340 may be formed of, for example, an amorphous carbon layer (ACL). The second mask patterns 340 may define positions of landing pads LP which will be discussed below. The second mask patterns 340 may be formed to vertically overlap the storage node contacts BC.

Referring to FIG. 8H, the second mask patterns 340 may be used as an etching mask to perform an anisotropic etching process in which the landing pad layer 352 is partially removed to form landing pads LP and simultaneously to form openings 354 that expose the diffusion stop layer 311.

Referring to FIG. 8I, an isotropic etching process may be performed in which the diffusion stop layer 311 exposed to the openings 354 is removed to form diffusion stop patterns 311a that are spaced apart from each other and simultaneously to expose the third sub-spacers 327 and portions of top surfaces of the bit line capping patterns 337. Depending on the degree of progress of the isotropic etching process, the diffusion stop patterns 311a may be over-etched to partially expose a bottom surface of the landing pad LP.

Referring to FIGS. 8I and 8J, an anisotropic etching process may be performed to remove portions of the bit line capping patterns 337 exposed to the openings 354 and also to remove the third sub-spacers 327, and as a result the sacrificial spacers 323 may be exposed. In this case, a second recess region R2 may be formed on the bit line capping pattern 337.

Referring to FIGS. 8J and 8K, the second mask patterns 340 may be removed. An isotropic etching process may be performed in which the sacrificial spacer 323 is removed to form a gap region GP between the first sub-spacer 321 and the second sub-spacer 325. A thermal decomposition layer 356 may be formed to fill the openings 354 and the second recess regions R2. The thermal decomposition layer 356 may also be formed on the landing pads LP. The thermal decomposition layer 356 may be formed to close an upper portion of the gap region GP.

Referring to FIG. 8L, a first annealing process may be performed in which an upper portion of the thermal decomposition layer 356 is thermally decomposed and removed to expose upper sidewalls and top surfaces of the landing pads LP and simultaneously to form thermal decomposition patterns 356a that are spaced apart from each other. A first capping layer 358 may be conformally formed on the thermal decomposition patterns 356a and the landing pads LP.

Referring to FIGS. 8L and 8M, a second annealing process may be performed in which the thermal decomposition patterns 356a are all be thermally decomposed and out-gassed through the first capping layer 358, which results in removal of the thermal decomposition patterns 356a. The gap region GP may then expand between the landing pads LP. The gap region GP may extend into a space between the first sub-spacer 321 and the second sub-spacer 325. A second capping layer 360 may be formed on the first capping layer 358.

Referring to FIGS. 8M and 8N, an etch-back and/or chemical mechanical polishing (CMP) process may be performed to remove the first and second capping layers 358 and 360 on the landing pads LP and to expose the landing pads LP. An etch stop layer 370 may be formed on the landing pads LP, the first capping pattern 358a, and the second capping pattern 360a. A first mold layer 372, a support layer 374, and a second mold layer 376 may be formed on the etch stop layer 370. The etch stop layer 370 and the support layer 374 may be formed of, for example, a silicon nitride layer. The first mold layer 372 and the second mold layer 376 may be formed of a material having an etch selectivity with respect to the support layer 374. For example, the first mold layer 372 and the second mold layer 376 may be formed of a silicon oxide layer.

Referring to FIGS. 8N and 8O, the second mold layer 376, the support layer 374, the first mold layer 372, and the etch stop layer 370 may be sequentially patterned to form bottom electrode holes BEH that expose the landing pads LP. A conductive layer may be formed to fill the bottom electrode holes BEH, and an etch-back or CMP process may be performed to remove the conductive layer on the second mold layer 376 and to form bottom electrodes BE in the bottom electrode holes BEH. A third mask pattern 378 may be formed on the second mold layer 376. The third mask pattern 378 may have an opening 378h that defines a support hole (see 374h of FIG. 6). The opening 378h may expose portions of top surfaces of neighboring bottom electrodes BE and also expose the second mold layer 376 between the neighboring bottom electrodes BE.

Referring to FIGS. 8O and 8P, the third mask pattern 378 may be used as an etching mask to perform an anisotropic etching process in which the second mold layer 376 exposed to the opening 378h and the support layer 374 below the second mold layer 376 are removed to form a support pattern 374a and to expose the first mold layer 372.

Referring to FIGS. 8P and 8Q, the third mask pattern 378 may be removed to expose the second mold layer 376. An isotropic etching process may be performed in which the first mold layer 372 and the second mold layer 376 are removed to expose a surface of the bottom electrode BE and a surface the support pattern 374a.

Subsequently, as shown in FIG. 7, a dielectric layer DL may be formed to conformally cover the surface of the bottom electrode BE and the surface of the support pattern 374a as discussed with reference to FIGS. 1 to 5D. A top electrode UE may be formed on the dielectric layer DL.

According to some example embodiments of the present inventive concepts, a method of fabricating a semiconductor memory device may reduce a surface roughness of a dielectric layer and may decrease a leakage current. Further, the method of fabricating a semiconductor memory device may use a thermal decomposition layer to easily form a gap region.

According to a semiconductor memory device and a method of fabricating the same in accordance with the present inventive concepts, a surface roughness of a dielectric layer may be improved to decrease a leakage current. As a result, the semiconductor memory device may increase in reliability.

The above-disclosed subject matter is to be considered illustrative, and not restrictive, and the appended claims are intended to cover all such modifications, enhancements, and other embodiments, which fall within the scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a capacitor lower electrode on the substrate and including titanium nitride;
a dielectric layer on the capacitor lower electrode and including a first dielectric layer and a second dielectric layer that is on the first dielectric layer; and
a capacitor upper electrode on the dielectric layer and including titanium nitride,
wherein the first dielectric layer includes hafnium oxide, and
the second dielectric layer includes:
a first metal region adjacent to the first dielectric layer;
a second metal region on the first metal region;
a third metal region on the second metal region;
a fourth metal region on the third metal region;
a first diffusion region between the first metal region and the second metal region of the second dielectric layer; and
a second diffusion region between the second metal region and the third metal region of the second dielectric layer,
wherein each of the first metal region and the third metal region of the second dielectric layer includes zirconium oxide,
each of the second metal region and the fourth metal region of the second dielectric layer includes aluminum oxide, and
each of the first diffusion region and the second diffusion region of the second dielectric layer includes aluminum.

2. The semiconductor device of claim 1, wherein at least one of the first diffusion region and the second diffusion region of the second dielectric layer includes zirconium.

3. The semiconductor device of claim 1, wherein the second dielectric layer includes a third diffusion region between the third metal region and the fourth metal region of the second dielectric layer, and
the third diffusion region of the second dielectric layer includes aluminum.

4. The semiconductor device of claim 3, wherein the third diffusion region of the second dielectric layer includes zirconium.

5. The semiconductor device of claim 1, wherein a thickness of the first diffusion region of the second dielectric layer in a direction that is perpendicular to a top surface of the substrate is greater than a thickness of the second diffusion region of the second dielectric layer in the direction.

6. The semiconductor device of claim 3, wherein a thickness of the third diffusion region of the second dielectric layer in a direction that is perpendicular to a top surface of the substrate is greater than a thickness of the second diffusion region of the second dielectric layer in the direction.

7. The semiconductor device of claim 1, wherein a surface roughness of the fourth metal region of the second dielectric layer is less than a surface roughness of at least one of the first metal region and the third metal region of the second dielectric layer.

8. The semiconductor device of claim 1, wherein the first dielectric layer has a tetragonal crystal structure, and
a dielectric constant of the first dielectric layer is greater than a dielectric constant of the second dielectric layer.

9. A semiconductor device comprising:
a substrate;
a capacitor lower electrode on the substrate;
a dielectric layer on the capacitor lower electrode; and
a capacitor upper electrode on the dielectric layer,
wherein the dielectric layer includes:
a first zirconium oxide region adjacent to the capacitor lower electrode;
a first aluminum oxide region on the first zirconium oxide region;
a second zirconium oxide region on the first aluminum oxide region;
a second aluminum oxide region on the second zirconium oxide region;
a first aluminum diffusion region between the first zirconium oxide region and the first aluminum oxide region;
a second aluminum diffusion region between the first aluminum oxide region and the second zirconium oxide region; and
a third aluminum diffusion region between the second zirconium oxide region and the second aluminum oxide region.

10. The semiconductor device of claim 9, wherein at least one of the first aluminum diffusion region, the second aluminum diffusion region and the third aluminum diffusion region of the dielectric layer includes zirconium.

11. The semiconductor device of claim 9, wherein the dielectric layer includes a hafnium oxide region between the capacitor lower electrode and the first zirconium oxide region of the dielectric layer.

12. The semiconductor device of claim 9, wherein each of the capacitor lower electrode and the capacitor upper electrode includes titanium nitride.

13. The semiconductor device of claim 9, wherein a thickness of the second aluminum diffusion region of the dielectric layer in a direction that is perpendicular to a top surface of the substrate is less than a thickness of at least one of the first aluminum diffusion region and the third aluminum diffusion region of the dielectric layer in the direction.

14. The semiconductor device of claim 9, wherein a surface roughness of the second aluminum oxide region of the dielectric layer is less than a surface roughness of at least one of the first zirconium oxide region and the second zirconium oxide region of the dielectric layer.

15. A semiconductor device comprising:
a substrate including an active region that includes a first portion and a second portion;
a bit line structure electrically connected to the first portion of the active region of the substrate;
a contact structure electrically connected to the second portion of the active region of the substrate;
a landing pad structure electrically connected to the contact structure and on the bit line structure, the landing pad structure including a diffusion stop pattern and a landing pad pattern that is on the diffusion stop pattern;
a capacitor lower electrode on the landing pad structure;
a dielectric layer on the capacitor lower electrode; and
a capacitor upper electrode on the dielectric layer,
wherein the diffusion stop pattern includes a sidewall that is recessed between the landing pad pattern and the bit line structure, and
the dielectric layer includes:
a first zirconium oxide region adjacent to the capacitor lower electrode;
a first aluminum oxide region on the first zirconium oxide region;
a second zirconium oxide region on the first aluminum oxide region;

a second aluminum oxide region on the second zirconium oxide region;
a first aluminum diffusion region between the first zirconium oxide region and the first aluminum oxide region; and
a second aluminum diffusion region between the first aluminum oxide region and the second zirconium oxide region.

16. The semiconductor device of claim 15, wherein the dielectric layer includes a hafnium oxide region between the capacitor lower electrode and the first zirconium oxide region.

17. The semiconductor device of claim 15, wherein the dielectric layer includes a third aluminum diffusion region between the second zirconium oxide region and the second aluminum oxide region of the dielectric layer.

18. The semiconductor device of claim 15, wherein a thickness of the first aluminum diffusion region of the dielectric layer in a direction that is perpendicular to a top surface of the substrate is greater than a thickness of the second aluminum diffusion region of the dielectric layer in the direction.

19. The semiconductor device of claim 17, wherein a thickness of the third aluminum diffusion region of the dielectric layer in a direction that is perpendicular to a top surface of the substrate is greater than a thickness of the second aluminum diffusion region of the dielectric layer in the direction.

20. The semiconductor device of claim 15, wherein a surface roughness of the second aluminum oxide region of the dielectric layer is less than a surface roughness of at least one of the first zirconium oxide region and the second zirconium oxide region of the dielectric layer.

* * * * *